United States Patent [19]

Schuetz et al.

[11] Patent Number: 5,051,600

[45] Date of Patent: Sep. 24, 1991

[54] PARTICLE BEAM GENERATOR

[75] Inventors: Marlin N. Schuetz, Raleigh, N.C.; David A. Vroom, Palo Alto, Calif.

[73] Assignee: Raychem Corporation, Menlo Park, Calif.

[21] Appl. No.: 569,329

[22] Filed: Aug. 17, 1990

[51] Int. Cl.$^5$ .............................................. H01J 37/00
[52] U.S. Cl. .......................... 250/492.3; 250/396 R; 250/396 ML; 250/398; 250/400
[58] Field of Search ............. 250/492.3, 398, 396 ML, 250/396 R, 400, 492.1

[56] References Cited

U.S. PATENT DOCUMENTS

| | | | |
|---|---|---|---|
| 2,887,583 | 5/1959 | Emanuelson | 250/400 |
| 2,897,365 | 7/1959 | Dewey, II et al. | 250/492.3 |
| 3,104,321 | 9/1963 | Smith, Jr. | 250/492.3 |
| 3,246,147 | 4/1966 | Skala | 250/492.3 |
| 3,455,337 | 7/1969 | Cook | 428/35.1 |
| 4,075,496 | 2/1978 | Vehara | 250/492.3 |

Primary Examiner—Jack I. Berman
Assistant Examiner—Kiet T. Nguyen
Attorney, Agent, or Firm—Herbert G. Burkard; Edith A. Rice; William D. Zahrt II

[57] ABSTRACT

A method for irradiating a workpiece, such as a strand, by charged particle, e.g. electron, bombardment is in accordance with the following steps:

generating a charged particle beam at one end of an elongated vacuum chamber by thermionic emission from an elongated emitter, accelerating the ribbon beam toward a longitudinally extending, radially curved window member, such as a tube, extending tranversely across another end of the vacuum chamber, the window tube having a length related to the width of the ribbon beams, dynamically deflecting the ribbon beam periodically back and forth to define a sweep field which contains the curved window member therein in accordance with a common predetermined deflection driving signal, dynamically converging the deflected ribbon beam onto the active area of the curved window in consonance with the deflection of the beam, in accordance with a predetermined convergence driving signal phase related to the deflection driving signal, so that the ribbon beam sweeps continuously and substantially perpendicularly over substantially the entire active area of the window, and drawing the workpiece to be irradiated through a passageway defined adjacent to the active area of the window tube as the ribbon beams sweep over the active area, thereby to cause charged particle bombardment of the workpiece. A particle beam irradiator, preferably implemented as a coaxial electron ribbon beam and its irradiation method form aspects of the present invention.

58 Claims, 18 Drawing Sheets

Microfiche Appendix Included
(1 Microfiche, 20 Pages)

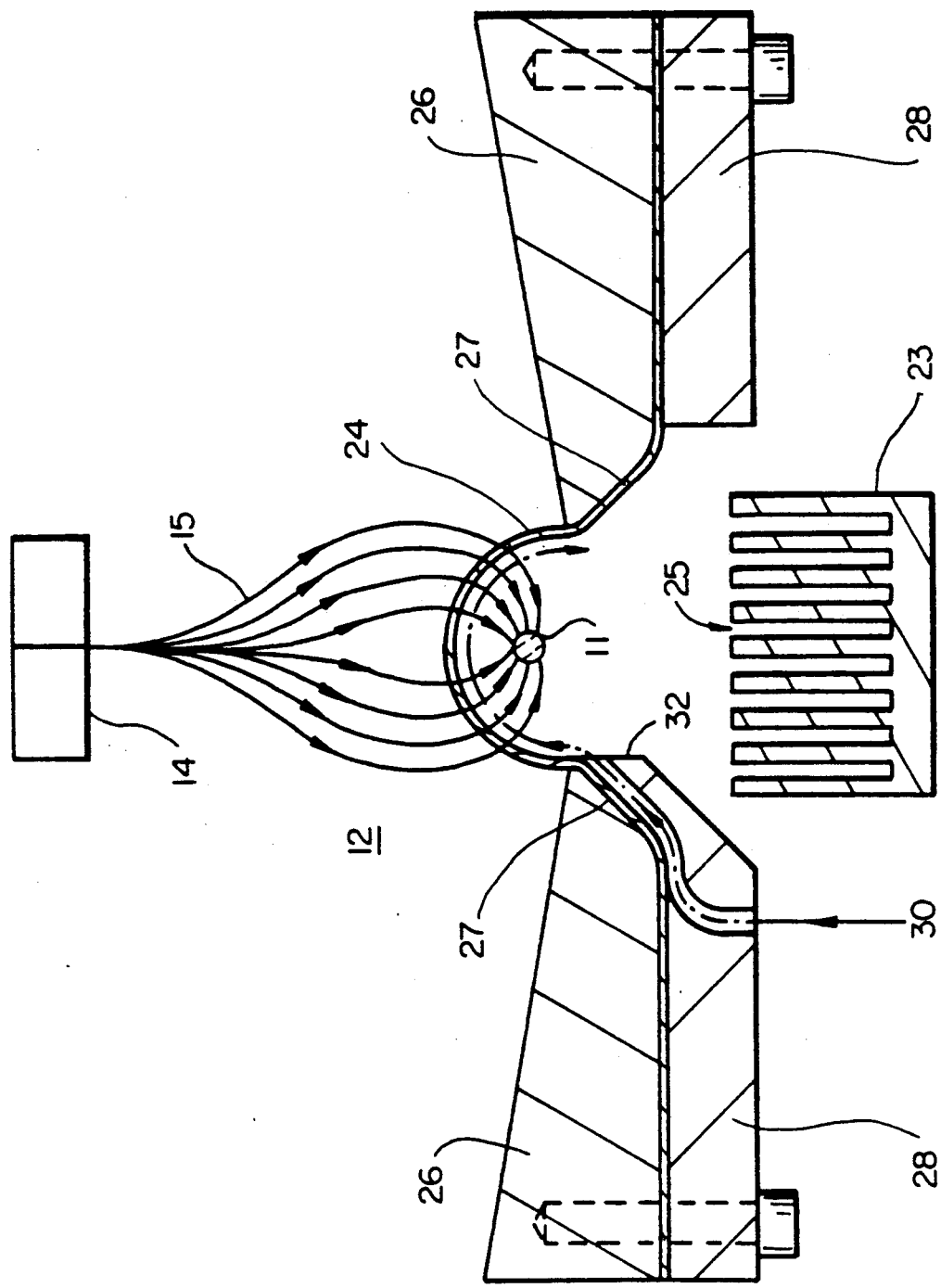
FIG_1A

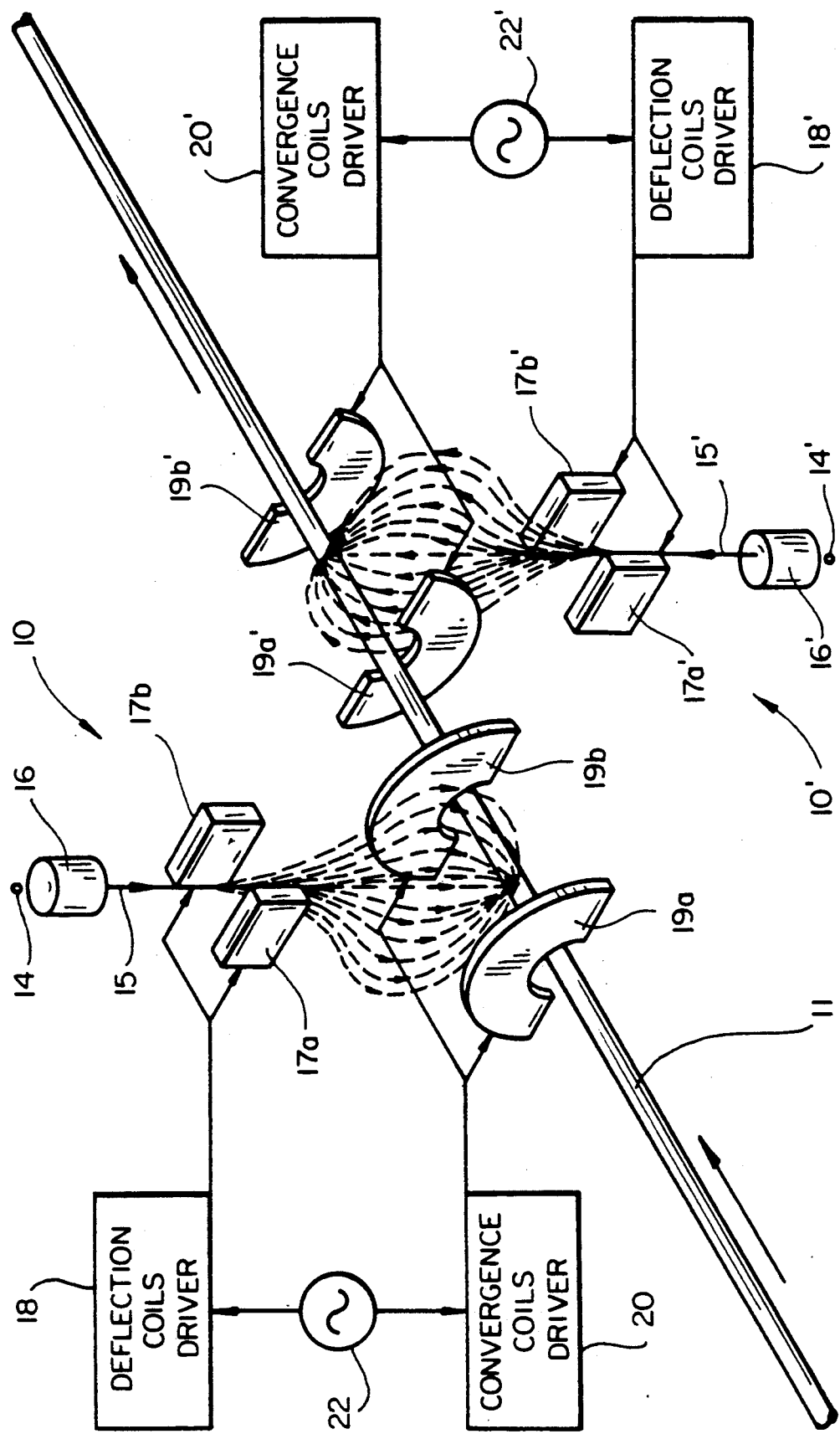
FIG_1B

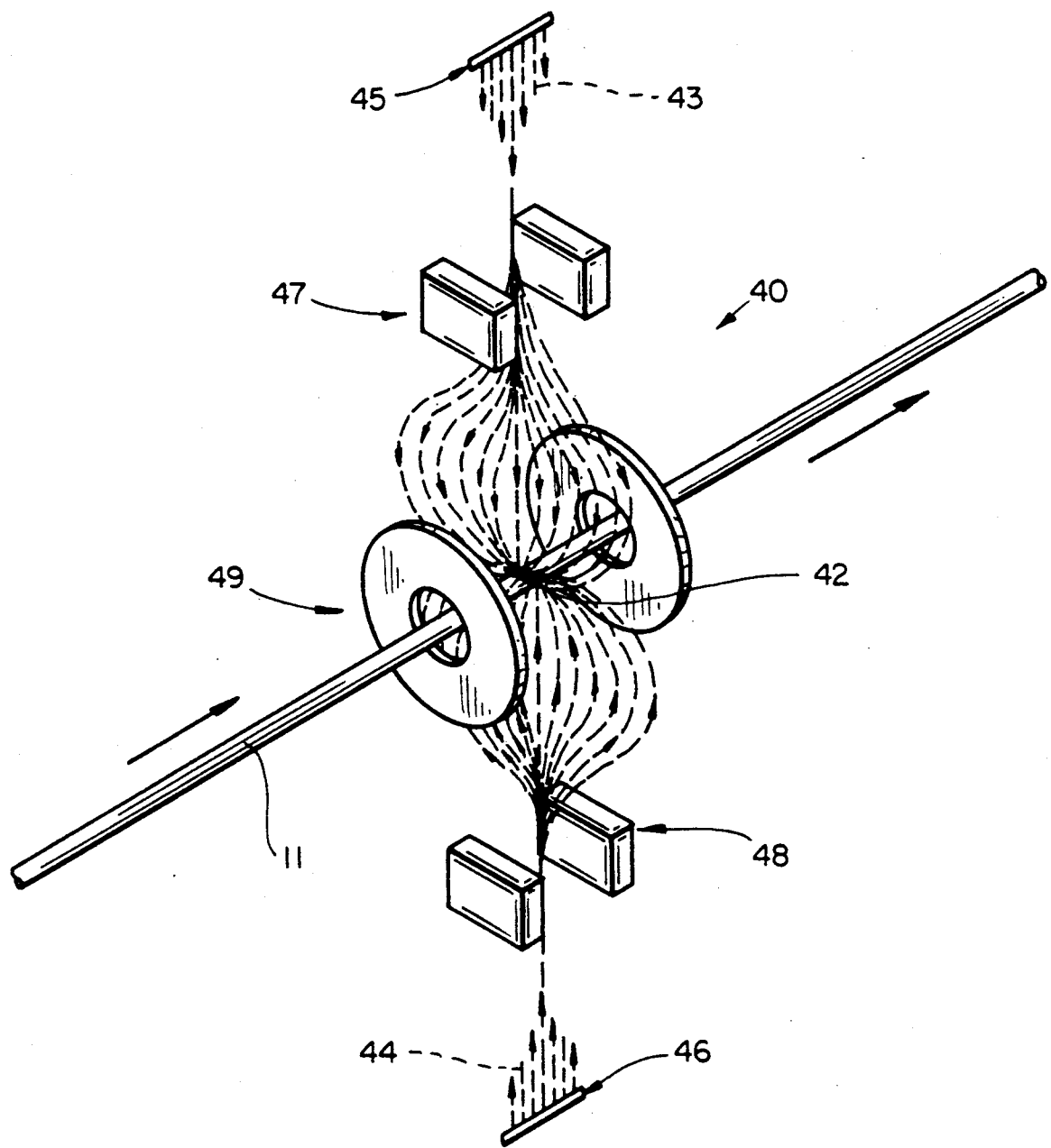
FIG_2

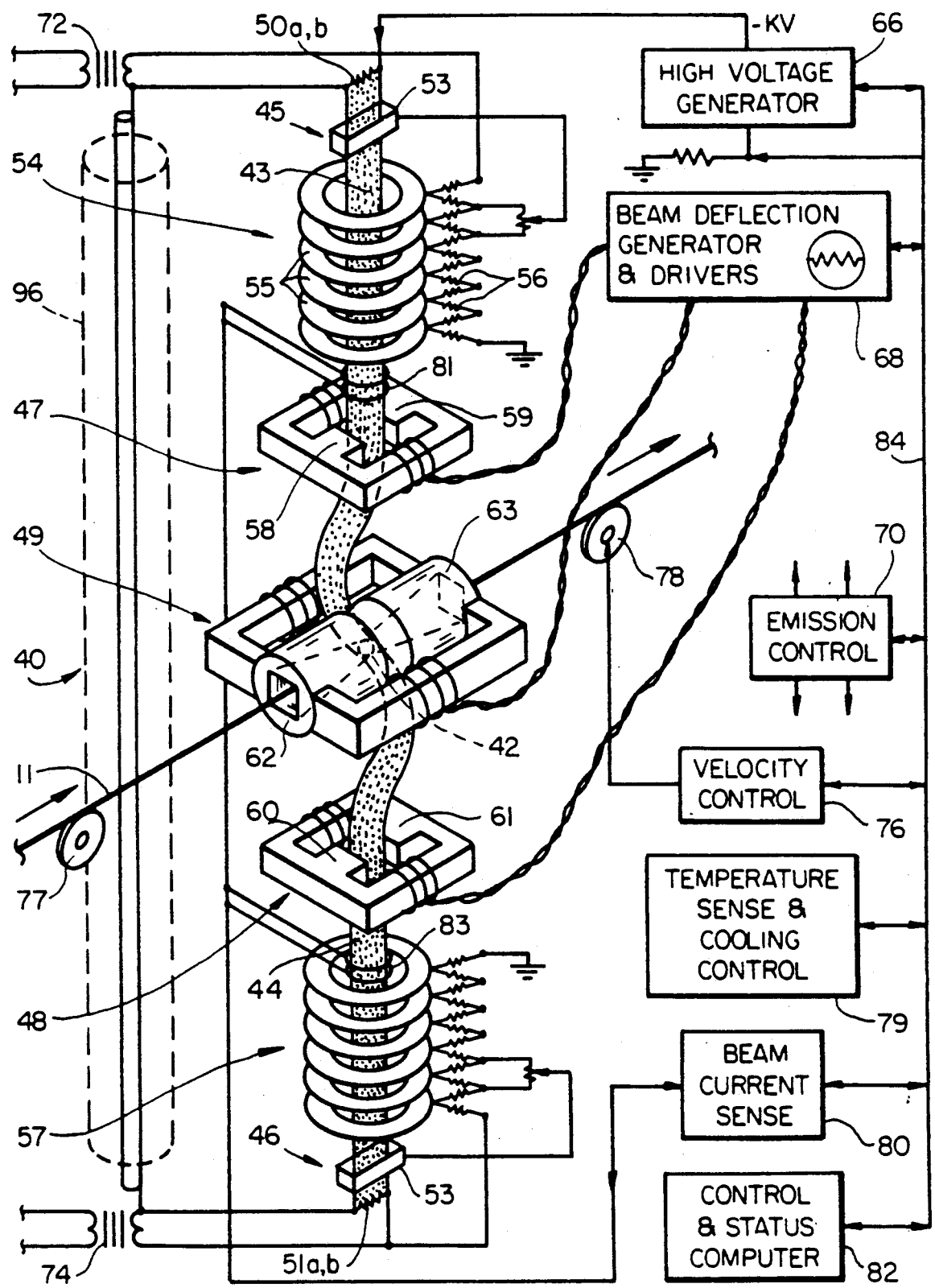
FIG_3

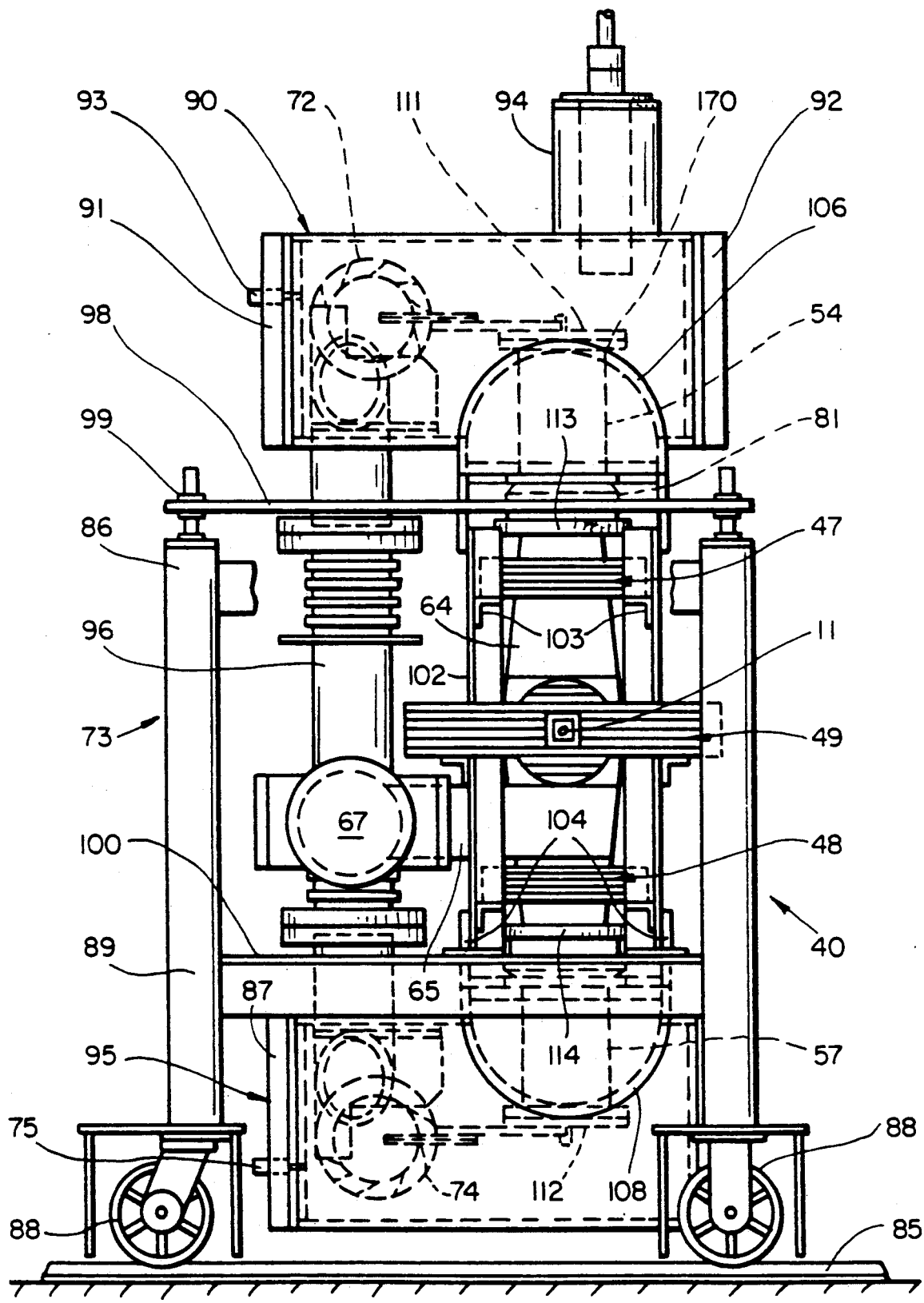
FIG_4

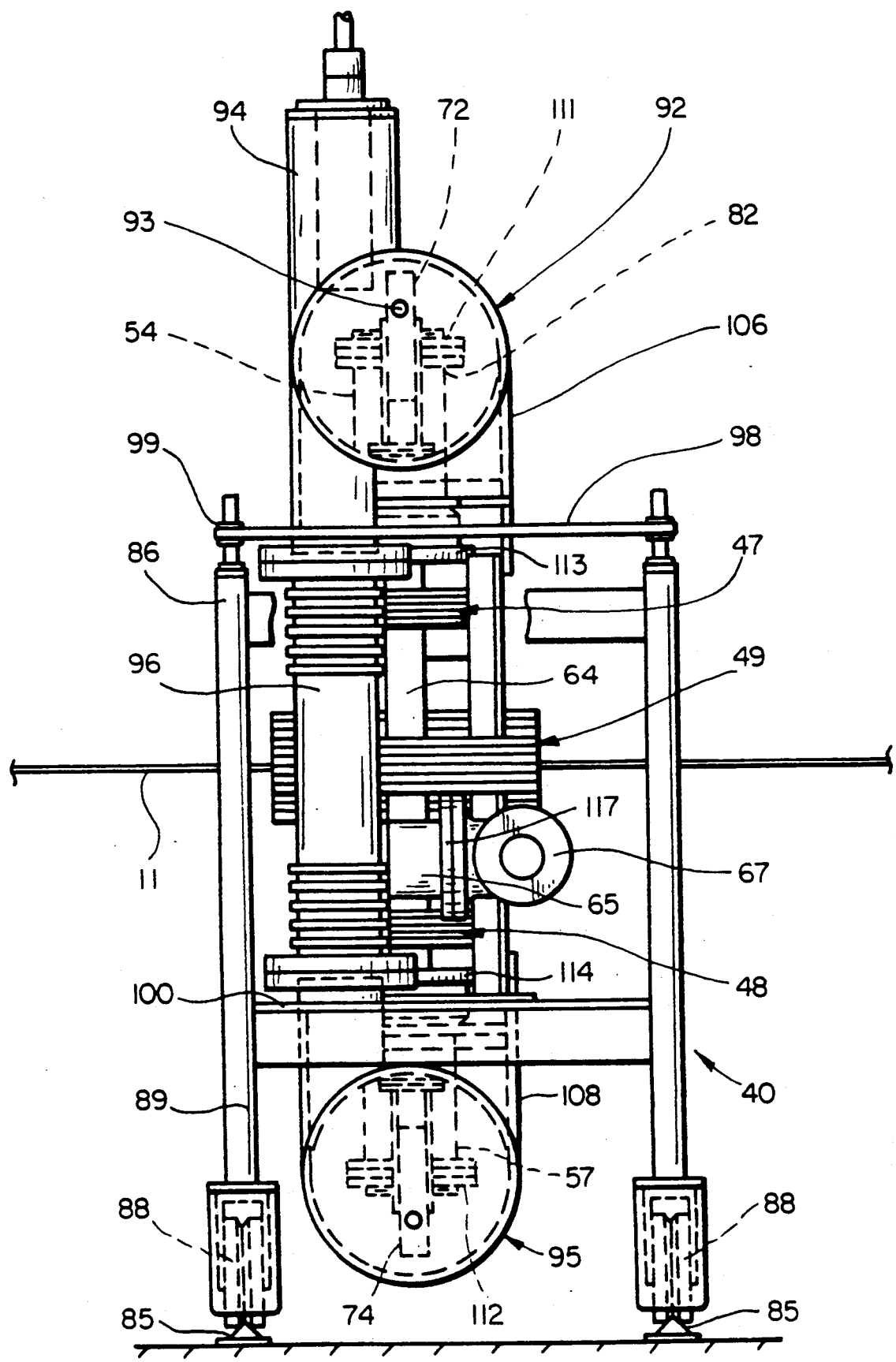
FIG_5

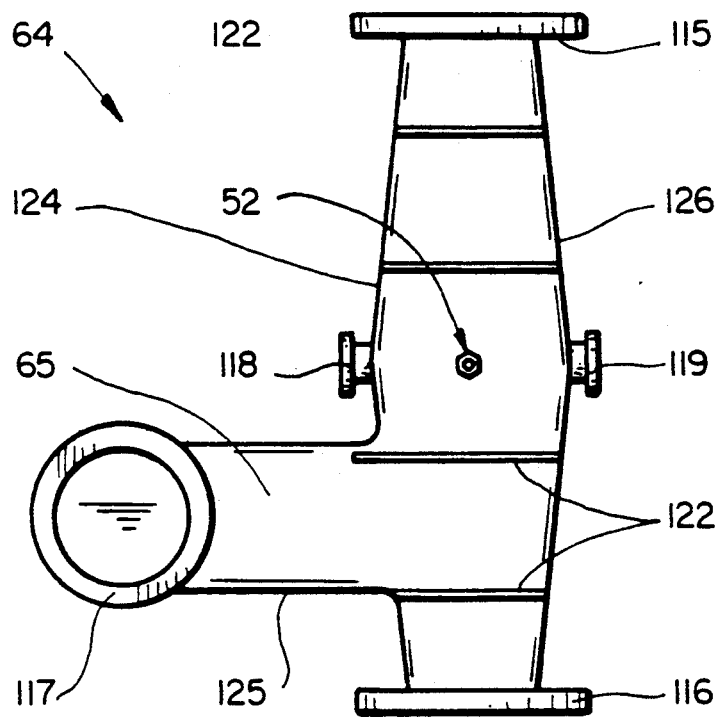
FIG_6
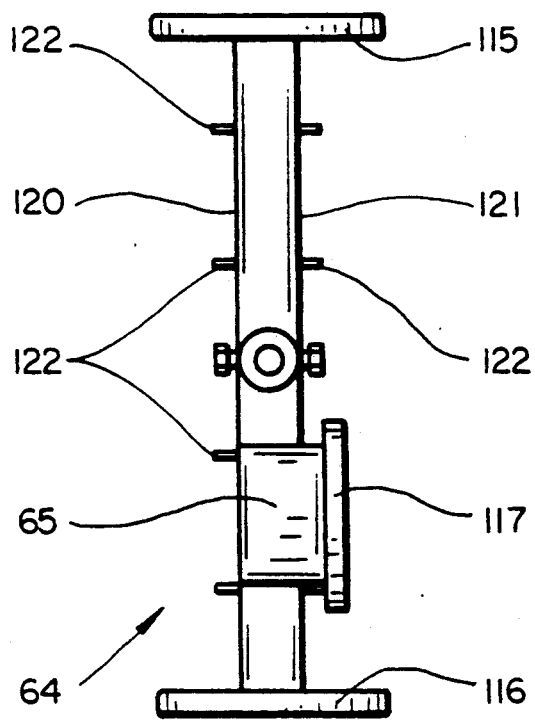
FIG_7

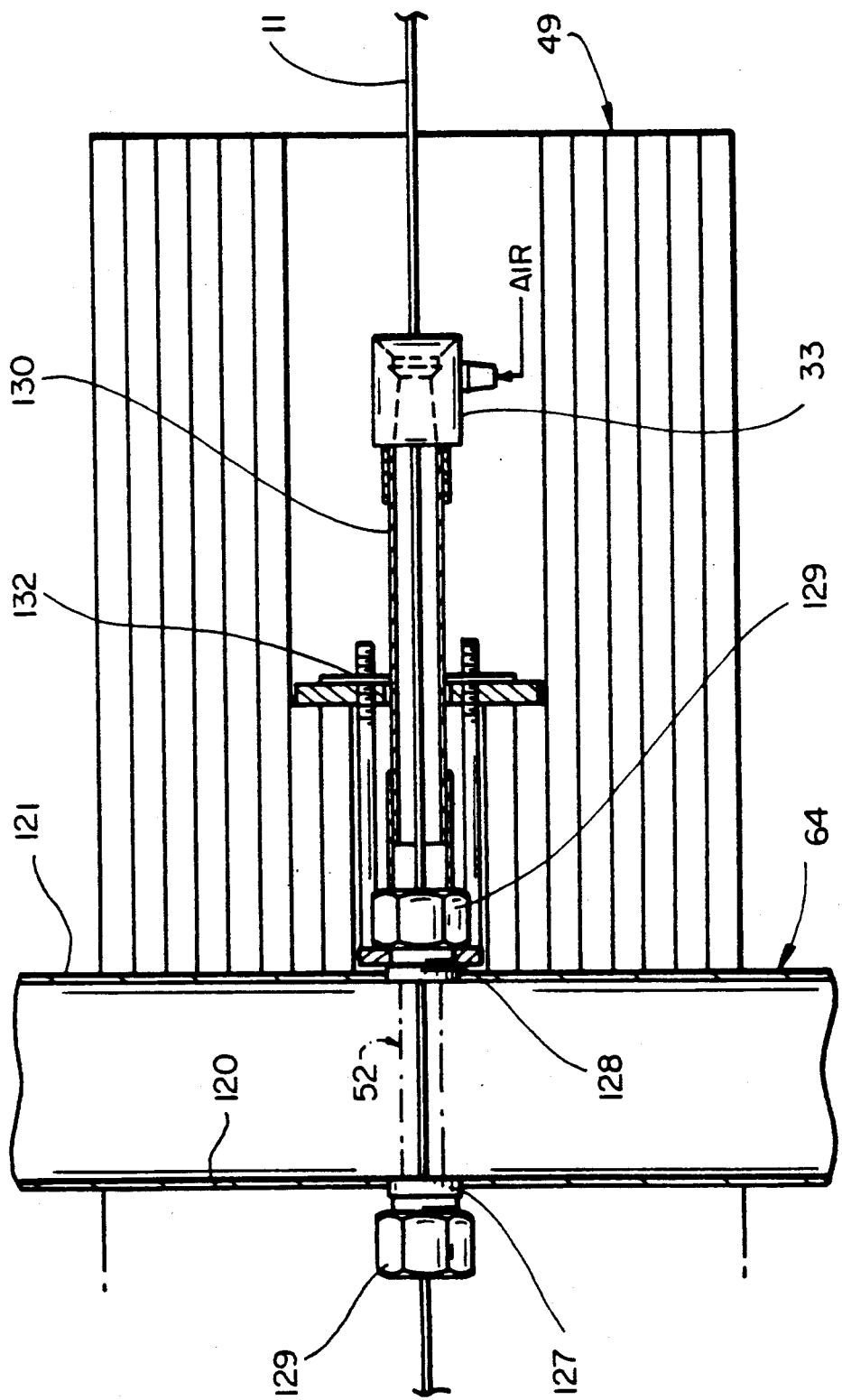

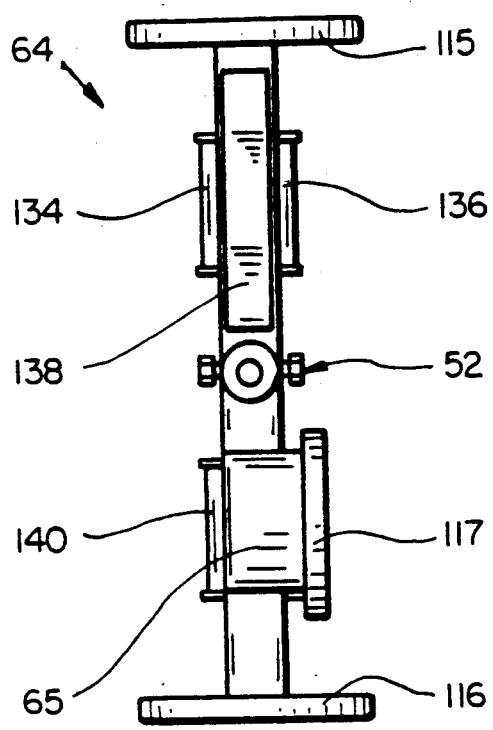
FIG_9
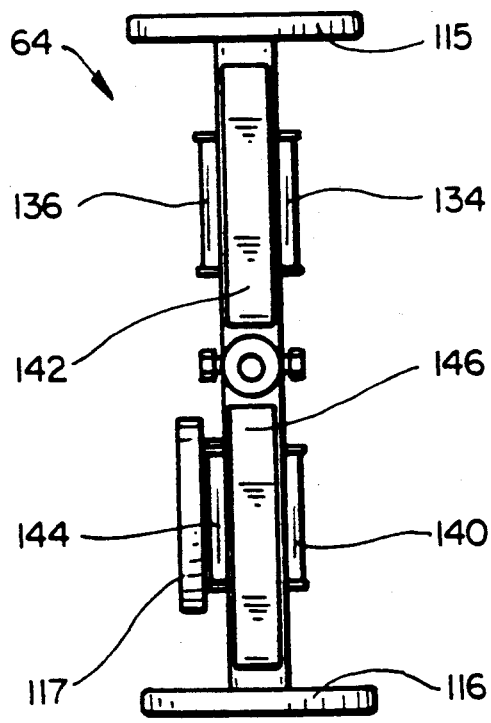
FIG_10

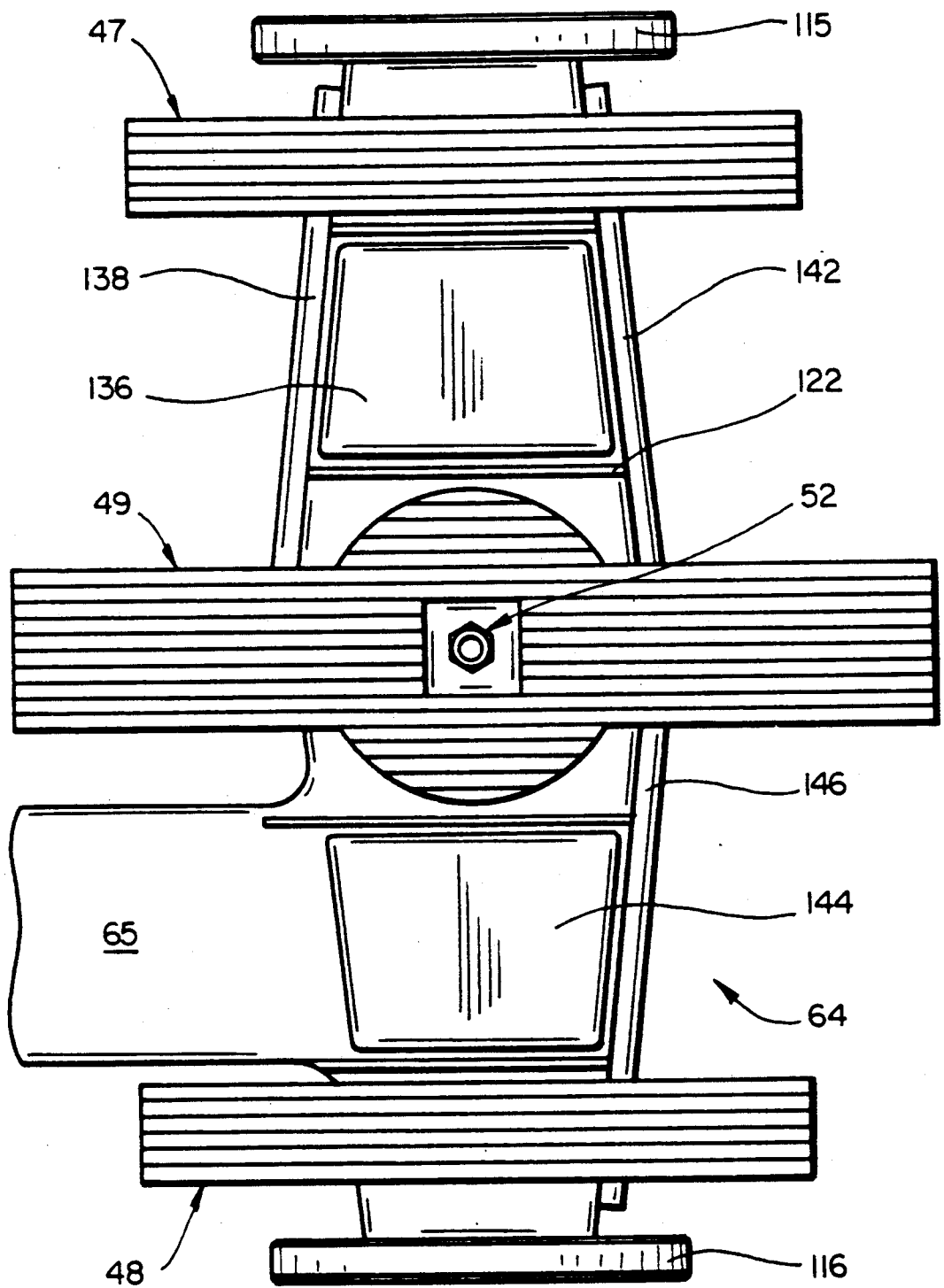
FIG_11

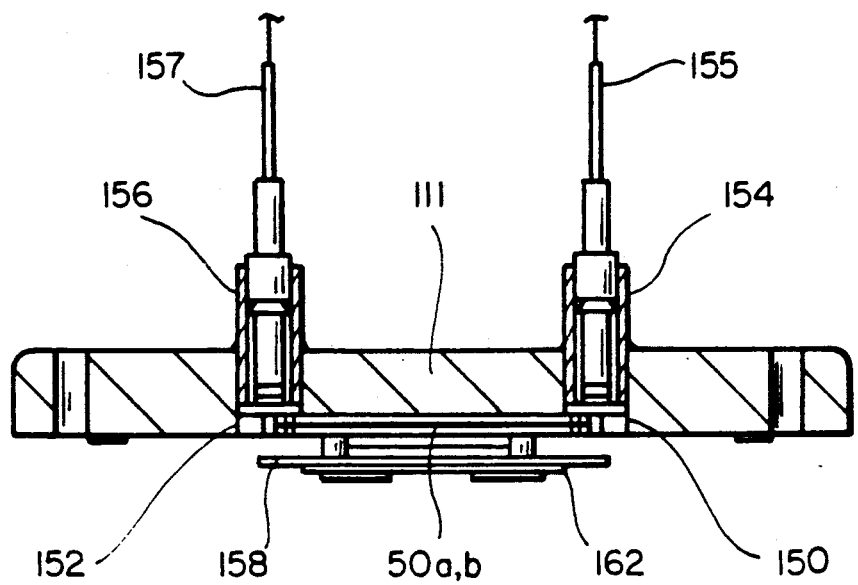
FIG_12
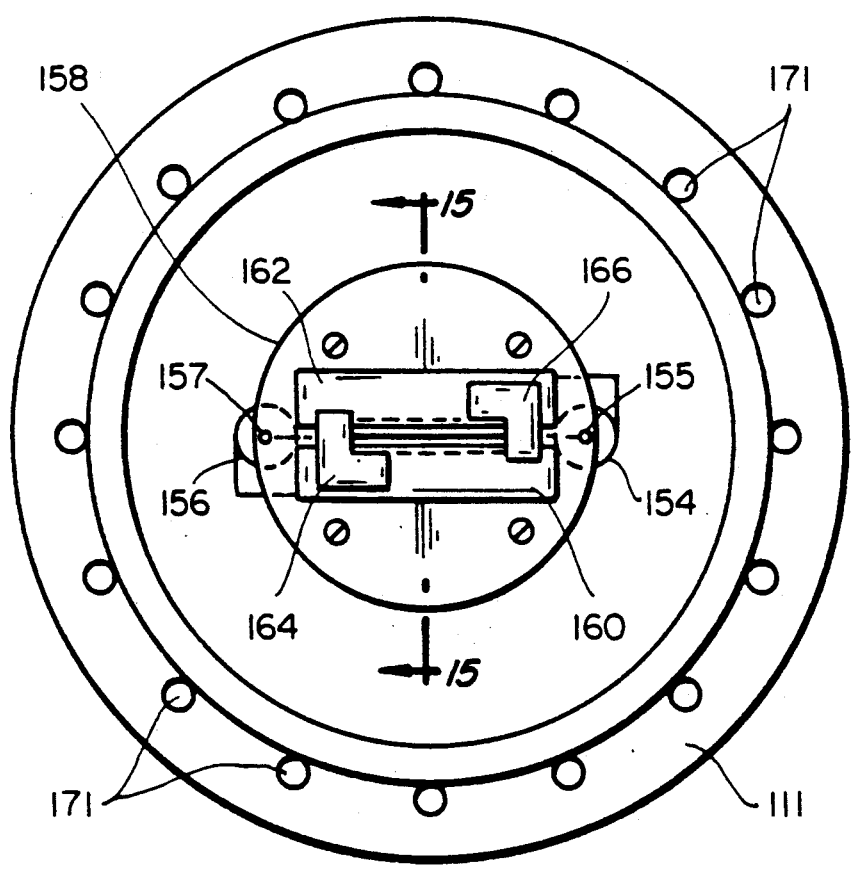
FIG_13

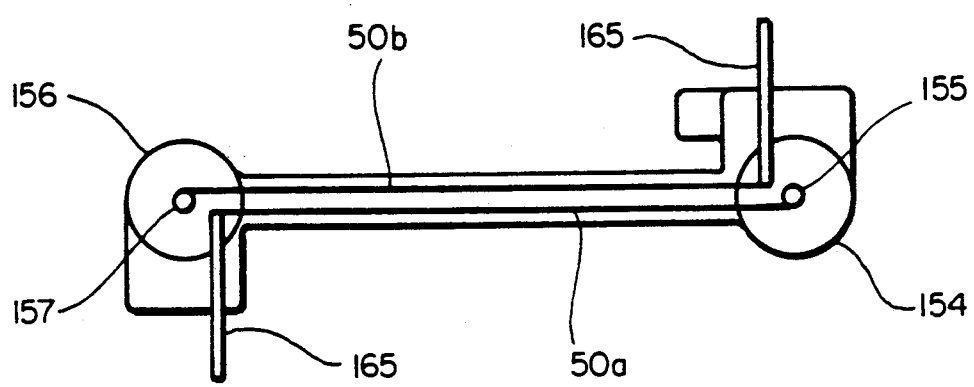
FIG_14
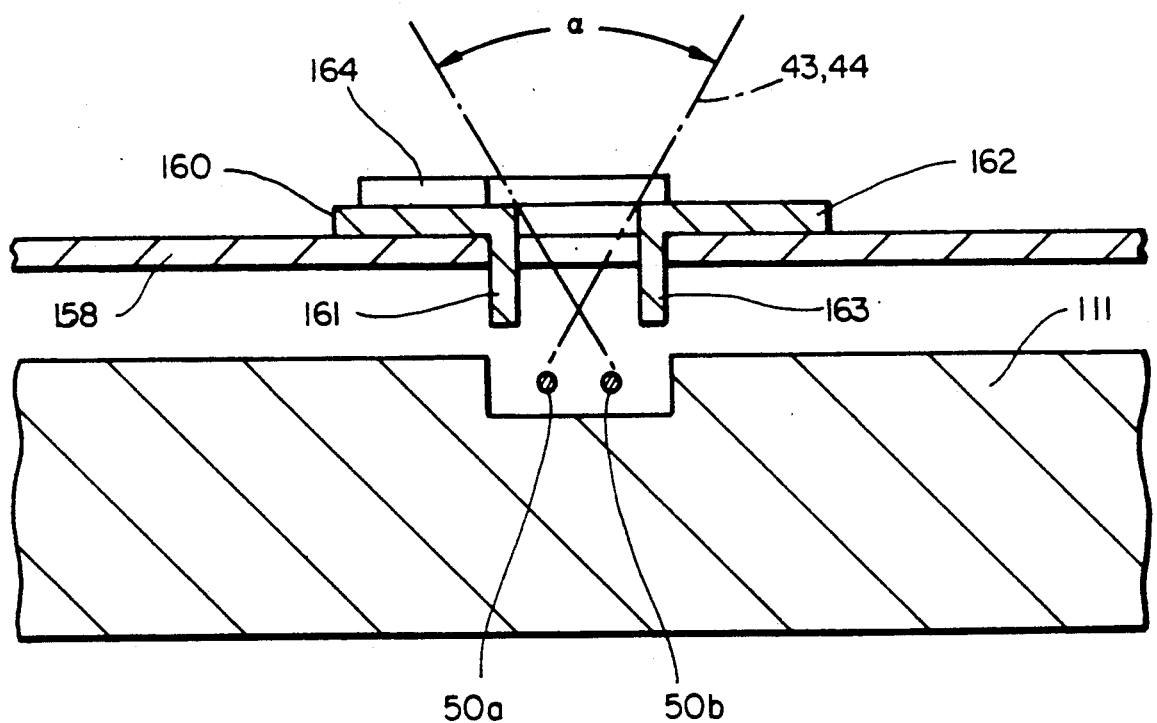
FIG_15

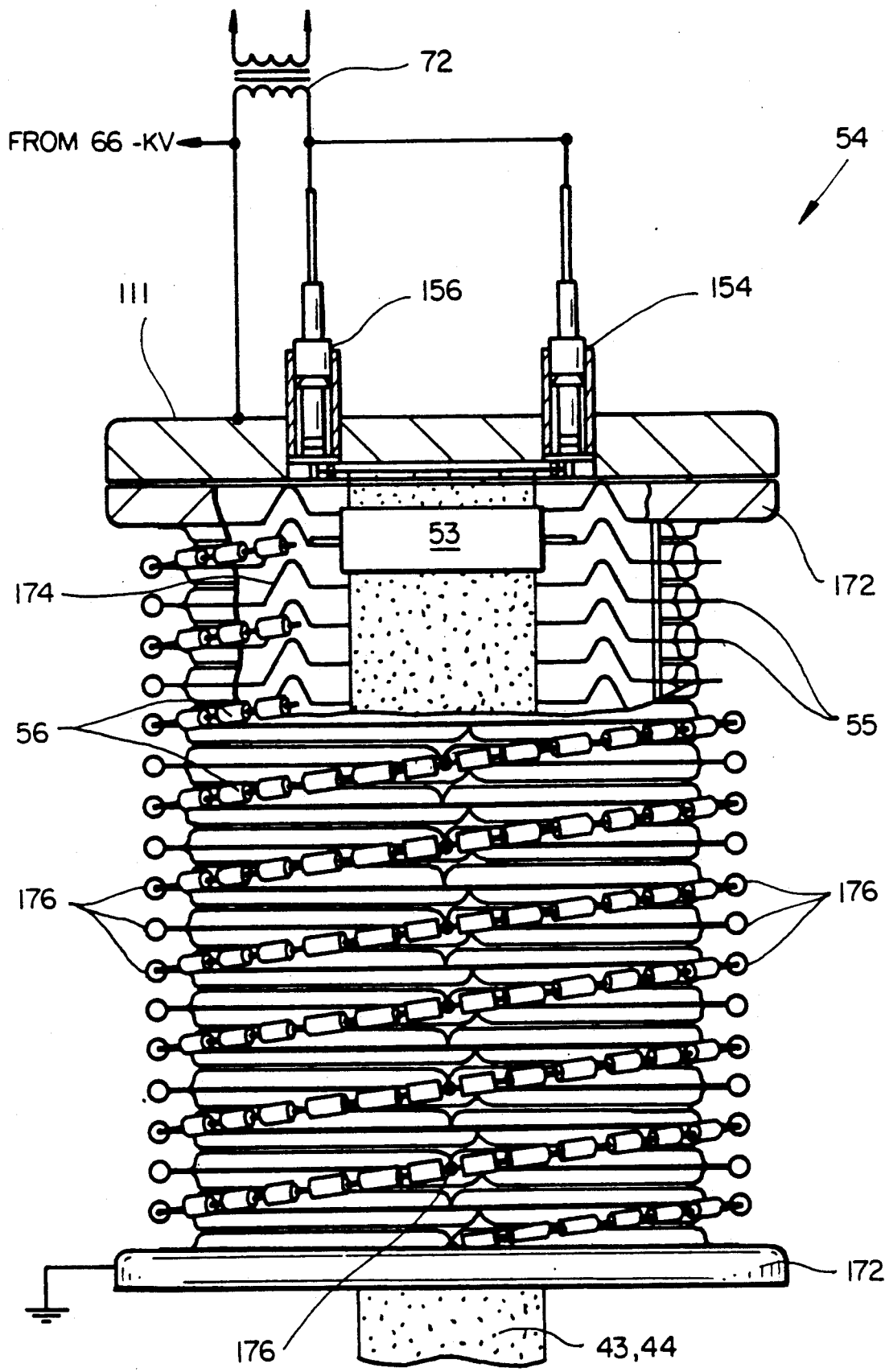
FIG_16

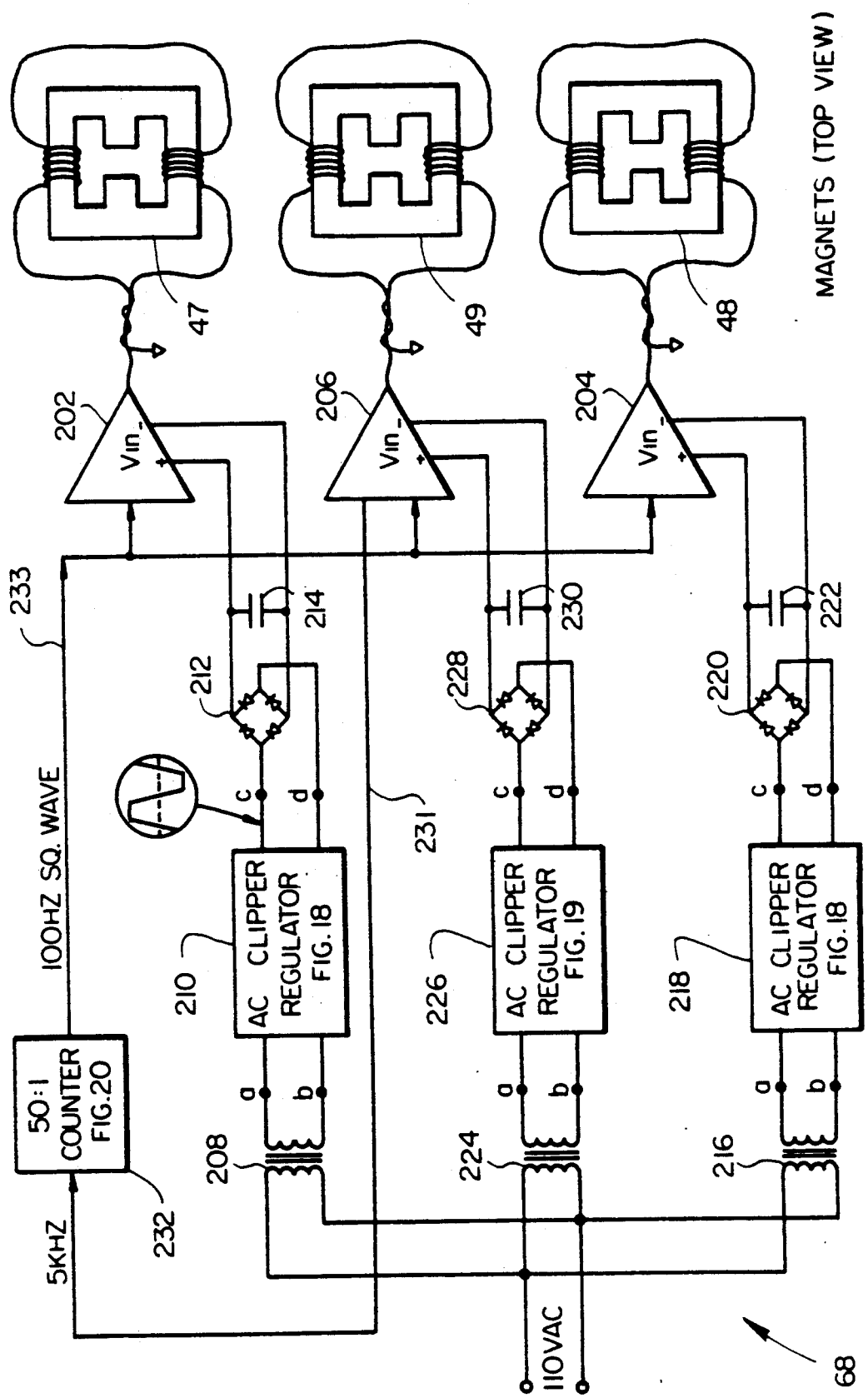
FIG_17

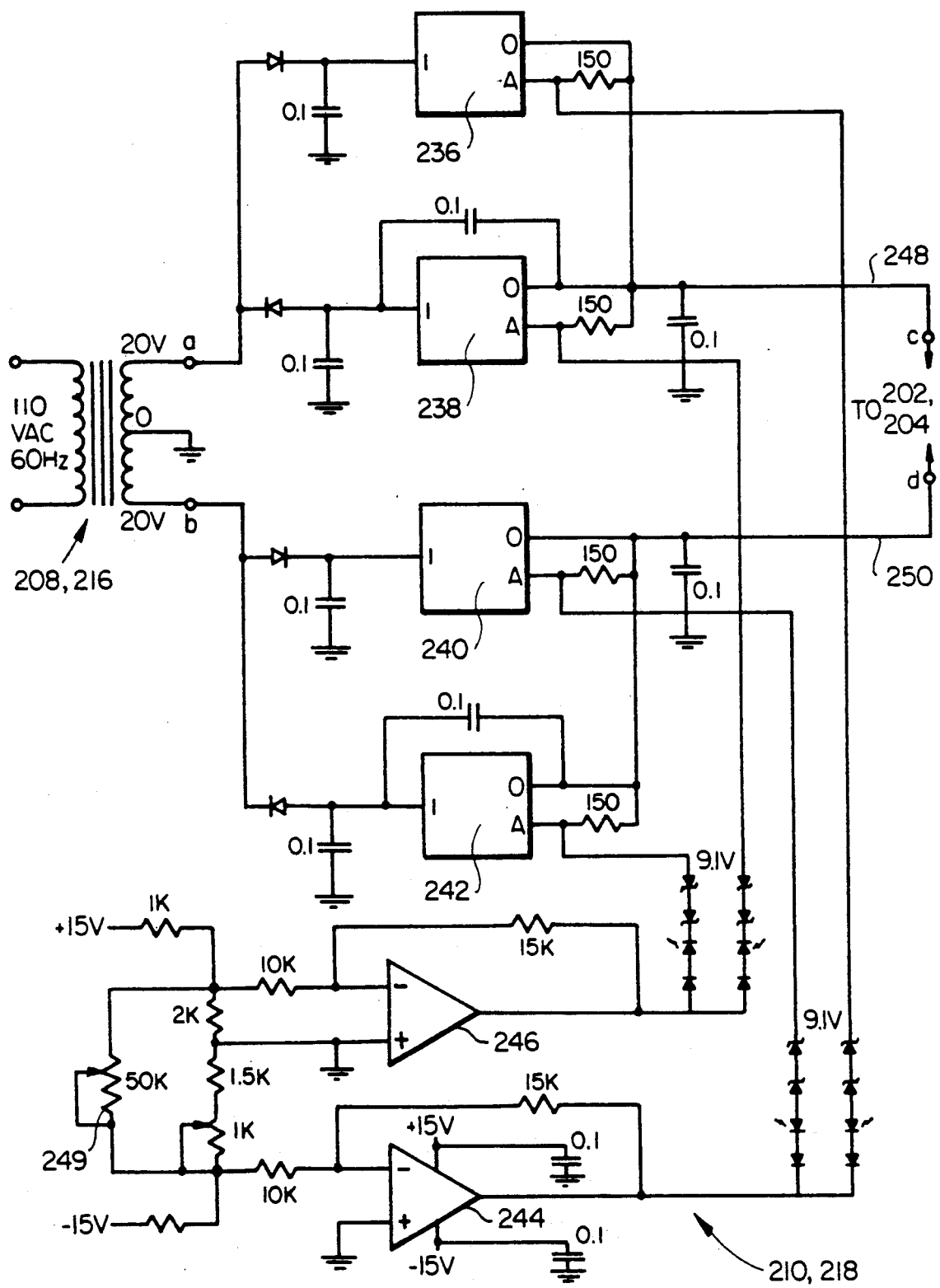
FIG_18

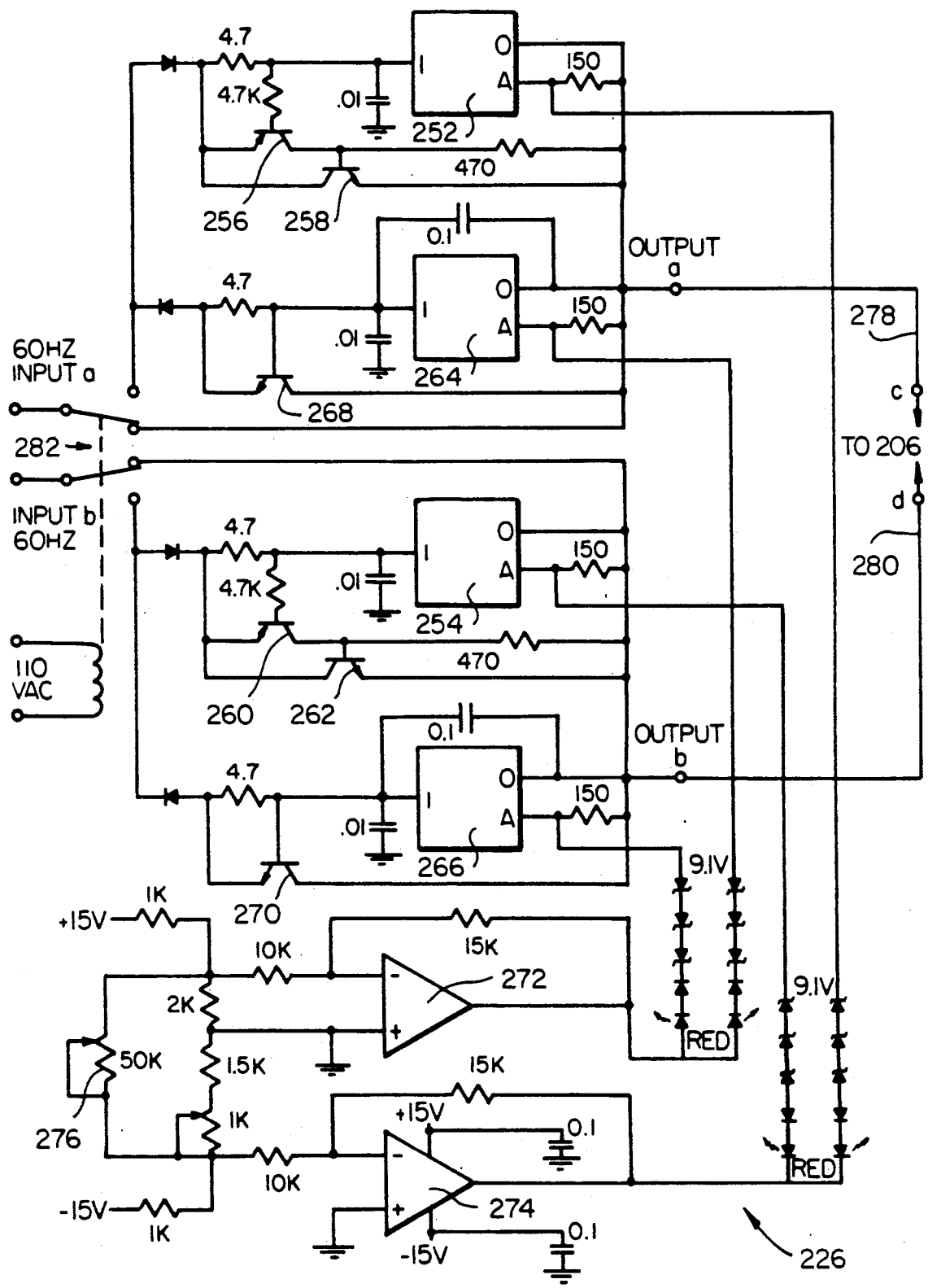
FIG_19

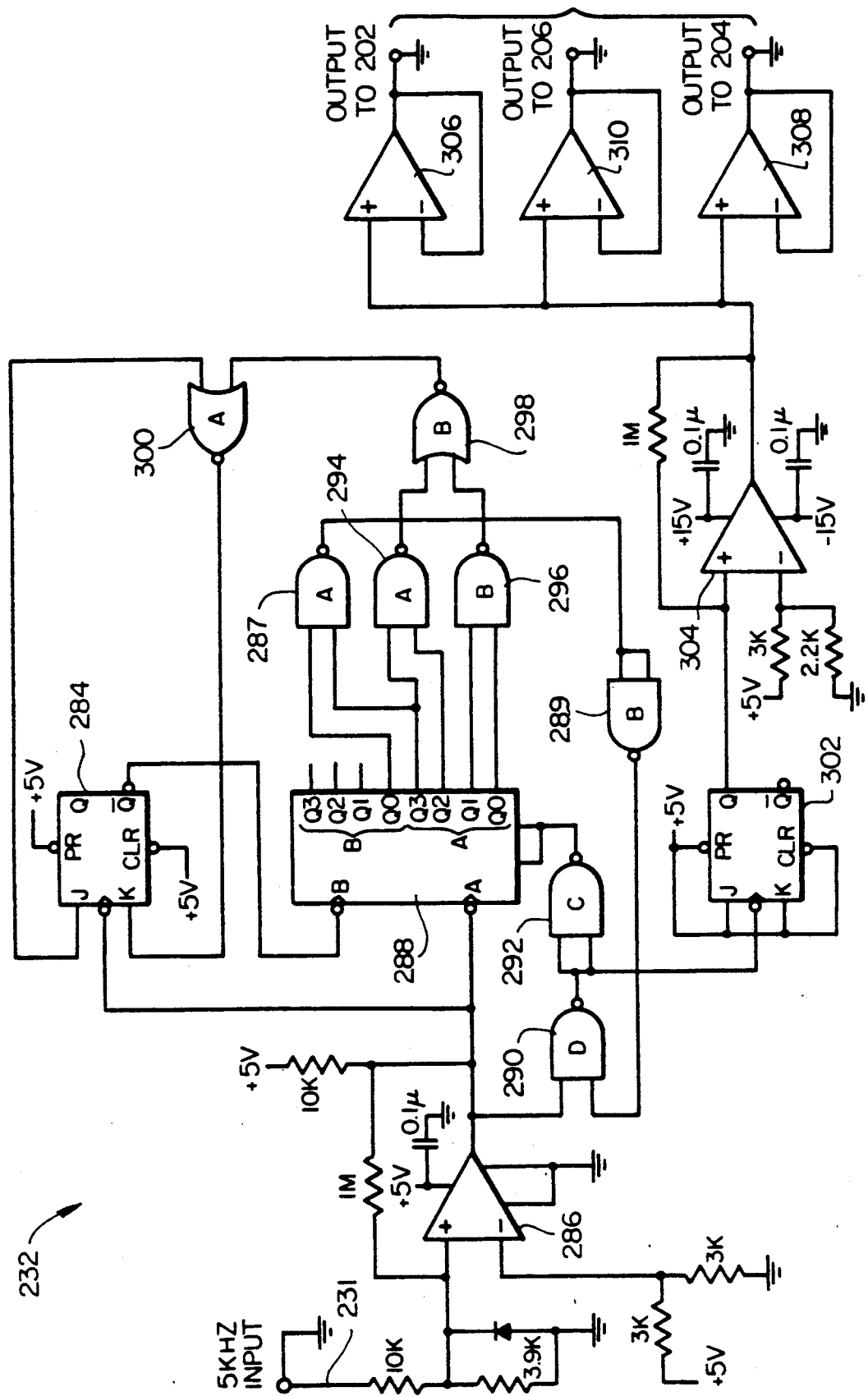
FIG_20

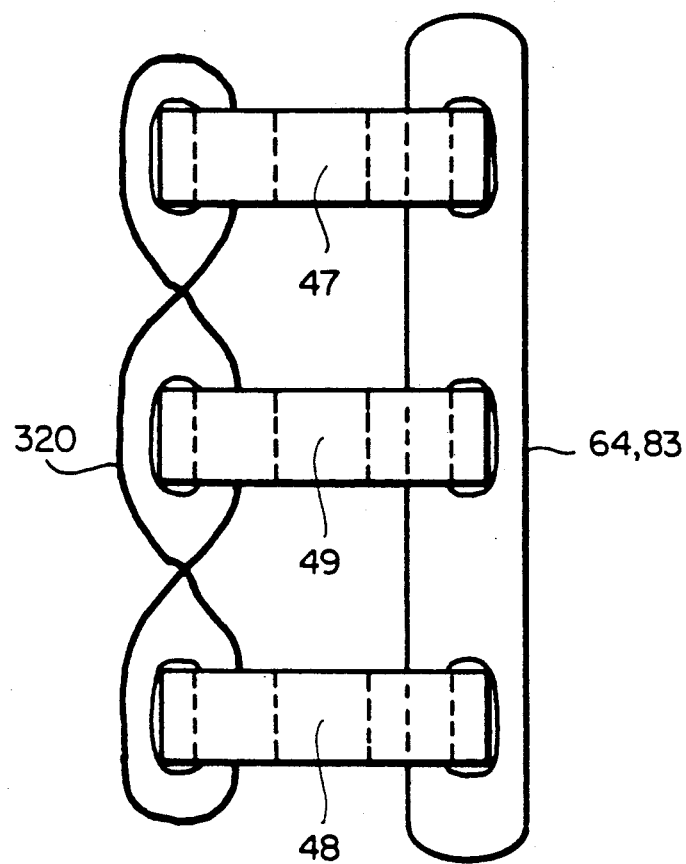
FIG_21
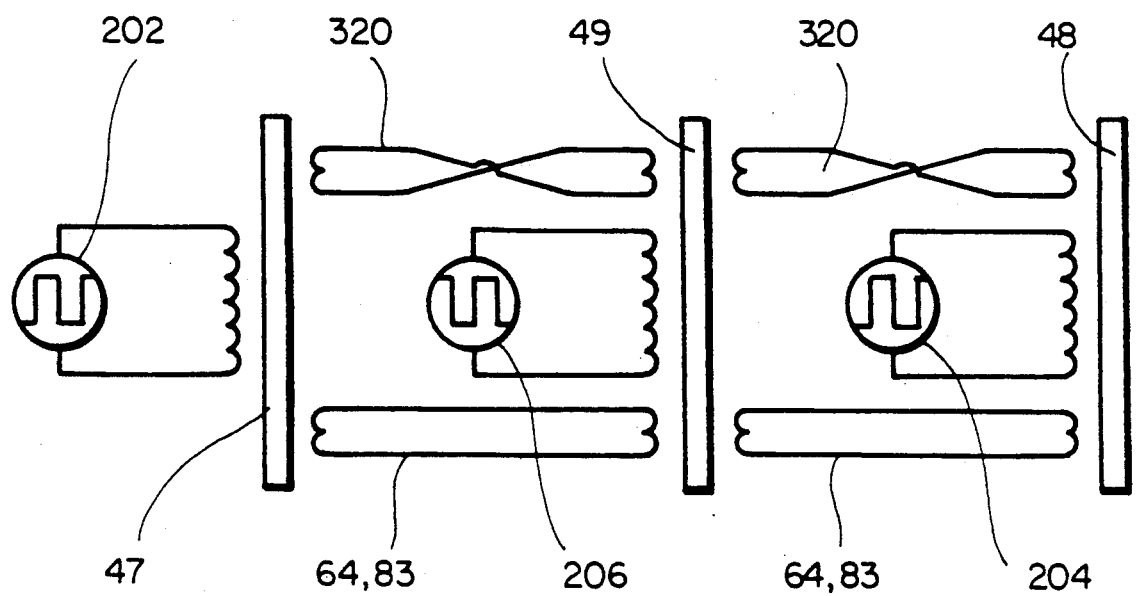
FIG_22

PARTICLE BEAM GENERATOR

REFERENCE TO MICROFICHE APPENDIX

A microfiche appendix comprising a computer program listing including twenty frames is a part of the specification of this patent.

REFERENCE TO RELATED APPLICATION

The present application is related to commonly assigned U.S. patent application Ser. No. 569,092 filed on the same date as the application leading to this patent and entitled: "Transmission Window for Particle Accelerator."

FIELD OF THE INVENTION

The present invention relates to electron and charged particle beam generation systems. More particularly, the present invention relates to a coaxial ribbon beam generator for generating a ribbon beam of electrons or charged particles enabling more uniform high energy irradiation of a coaxially disposed workpiece.

BACKGROUND OF THE INVENTION

It is known that the cross linking of polymer plastic material is enhanced and promoted through irradiation of the material by electron beam bombardment. Within manufacturing processes, the electron beam must be of sufficient energy and intensity so that a sufficient number of electrons penetrate sufficiently into the material to provide the desired radiation treatment. Providing a controlled radiation dosage circumferentially to an outer surface of an elongated workpiece, such as a continuous strand or tube, has resulted in advantageous materials properties, such as differentially cross-linked polymer of the type described in commonly assigned U.S. Pat. No. 3,455,337.

However, providing a useful radiation circumferential dosage has been problematical with various approaches of the prior art, and providing a consistently uniform circumferential dosage has heretofore proven to be very difficult to achieve as an efficient or effective industrial process.

Electron beams used for irradiating materials such as small diameter wire and cable insulation, plastic tubes, tapes, filaments, strands and the like (hereinafter individually and collectively referred to as "strands") have required high accelerating voltages of up to one million volts, or more. Apparatus for generating electron beams for irradiation is typically large, and is typically contained in a special room or enclosure, and the irradiation process is carried out in a vault providing sufficient shielding so that radiation hazards are contained to the product being processed and are not presented to operating personnel.

In the case of irradiation of strands, one prior approach has been manually to thread the strand supplied from a feed reel about sets of sheaves in multiple loops, and then on to a take-up reel where the irradiated strand is coiled. The sheaves are contained in the vault adjacent to a thin metal foil exposure window of a scanned high energy electron beam accelerator. The multiple loops enable the strand to be irradiated during multiple passes through the exposure window. The amount and uniformity of irradiation has depended upon the scan rate and the travel rate of the strand, and upon an assumption that the strand rotates as it loops over the sheaves and therefore exposes the entirety of the surface thereof to irradiation from the scanned beam. This assumption is refuted somewhat by the fact that the strand takes a particular set when first loaded onto a takeup reel following the extrusion process, and this set is maintained during the subsequent irradiation process despite multiple loops of the strand about the sheaves and multiple loops of the strand passing by the exposure window.

Since irradiation of the looped strand has not been uniform, one prior proposal has been to provide permanent magnets below the sheaves under the exposure window. The magnets establish a fixed magnetic field of sufficient magnitude to reverse the direction of some portion of the electrons and return them to the sides of the looped strand opposite to the electron gun direction of incidence. While this approach has resulted in some improvement in the uniformity of irradiation, the irradiation process has remained cumbersome, and consequently off-line with respect to the extrusion process producing the strand.

Another approach, known in the art as the "toroid" approach, has been advanced. In this "single pass" approach, a window has been provided at the axial center of the apparatus. The window defines an orifice or passageway for the strand. A toroidal vacuum chamber radially surrounds the window; and a circular electron gun apparatus formed at the periphery of the toroidal chamber emits and accelerates electrons toward the window from e.g. 360 degrees. While this concept proposed a single-pass irradiation process, it has not yet been proven to be commercially practical or successful.

One other one-pass approach has been to dispose e.g. three electron guns about a coaxial window with 120 degree displacement from gun to gun. However, this approach is even more costly and cumbersome than the single swept-beam approach.

Despite the prior art approaches, a fundamental problem has been the unsolved need for a method and apparatus for maximizing radiation intensity and uniformity while at the same time exposing the strand to the radiation through a small window or port which is situated as closely to the strand as possible.

Thus, a hitherto unsolved need has arisen for a high energy particle beam generator enabling effective and more uniform irradiation of a strand which overcomes the limitations and drawbacks of the prior art.

SUMMARY OF THE INVENTION WITH OBJECTS

A general object of the present invention is to provide an accelerated particle beam generator which overcomes limitations and drawbacks associated with prior irradiation methods and systems by providing more uniform irradiation at higher efficiency then hitherto obtained.

A specific object of the present invention is to provide an improved apparatus for in-line beaming of strands having small dimension cross sections.

Another specific object of the present invention is to provide a self shielded, compact, easily positionable (i.e. portable) particle beam accelerator for generating and putting out an irradiation beam having high energy.

One more specific object of the present invention is to provide an improved irradiation method and apparatus for uniform one or two pass irradiation of small-diameter continuous strands. The apparatus preferably includes an elongated curved window of thin metal foil which simultaneously achieves reduced mechanical hoop stress and greater cooling efficiency, both results enabling greater thermal loading (heating) of the window from the radiation beam while withstanding the high vacuum to ambient environment interface stresses. A small transverse radius of curvature of the window also provides for increased irradiation efficiency, since the window is thereby able to be closer to the strand and thereby minimize losses due to the angularity of electron scattering upon emergence from the window media and approach to the strand.

A further specific object of the present invention is to provide a coaxial ribbon beam radiation accelerator empolying plural swept and converged irradiation beam ribbons which sweep continuously and approximately perpendicularly across the entire area of a small diameter beam window tube formed of a very thin foil so as to maximize efficiency of transfer of radiation to a strand passing inside of the tube while minimizing local heating of the window tube foil. Yet one more specific object of the present invention is to provide an irradiation beam accelerator apparatus which continuously imparts a more uniform dose to a small cross section strand passing therethrough.

Still one more specific object of the present invention is to provide an intensity controlled irradiation beam accelerator apparatus which continuously imparts a precisely controlled uniform dose throughout a surface area or layer of a small cross section strand passing therethrough, thereby controllably and uniformly cross linking the surface area or outer layer a polymer comprising the strand differentially with respect to an inner layer or region of the strand polymer.

Still one more specific object of the present invention is to provide a compact, portable, fully shielded irradiation beam processor which is positionable in-line with, and following, an existing materials process, e.g. an extrusion process, so that a strand polymer may be irradiated following the preceding materials process.

One more specific object of the present invention is to provide an improved, single pass beam irradiator for continuously imparting a more uniform dose to a small cross section strand passing therethrough.

One more specific object of the present invention is to provide an improved, single pass beam irradiator for irradiating a strand which is easily repositionable within a manufacturing facility, which provides ready access to the components and parts thereof, which provides adequate shielding for safety, and which operates reliably under the control and supervision of a programmed controller.

Still one more object of the present invention is to provide an improved beam generator arrangement enabling generation of a ribbon beam suitable for synchronous deflection and convergence for continuous impingement at approximately perpendicular angles of incidence over the surface of a strand via a curved active transmission window.

A method of incorporating the principles of the present invention enables irradiation of a strand by high energy beam bombardment in accordance with these steps:

generating at least one particle beam within an elongated evacuated chamber, such as a beam of electrons by thermionic emission from at least one elongaged electron beam emitter, focusing and accelerating the particle beam toward a window member extending transversely across a central region of the vacuum chamber, the curved window member having a predetermined axial length and a predetermined radius of curvature over an active beam exposure area, dynamically deflecting the particle beam periodically back and forth to define a sweep field which contains the window member therein in accordance with a predetermined deflection driving signal, dynamically converging the deflected particle beam through opposite active surface area regions of the window member in consonance with the deflection of the beam, in accordance with a predetermined convergence driving signal phase related to the deflection driving signal, so that the particle beam sweeps approximately perpendicularly over the active surface area of the window member, and positioning the strand to be irradiated in a passageway adjacent to the curved window as the particle beam sweeps over the active surface area thereof, thereby to cause particle beam bombardment of the surface areas of the strand facing the beam.

In one preferred implementation of the present invention a coaxial charged particle beam generator, such as an electron ribbon beam generator, achieves a single pass irradiation process for a continuous strand which moves coaxially through the generator. The generator includes a central tubular irradiation window through which the strand passes and a vacuum chamber including a pair of electron beam accelerators diametrically opposed with respect to each other and directed toward opposite sides of the tubular window. Each accelerator includes an elongated cathode for emitting a ribbon of electrons, the elongated cathode having an axis substantially parallel with the longitudinal axis of the tubular irradiation window. Electromagnetic electron beam deflectors are positioned between the accelerators and the window, and each deflector deflects the ribbon of electrons emitted by its associated emitter to define a beam sweep volume, with the angle of deflection being less than 90 degrees. Two dynamic convergence poles of an electromagnet are disposed at each end of the tubular irradiation window. Thus, the entirety of an active area of the transmission window is swept by the two electron beam ribbons which have an approximately perpendicular angle of incidence with respect to the strand, in accordance with a common deflection/convergence driving signal. The result is that the entirety of the surface of the strand passing through the tubular window at its predetermined rate of travel is also continuously and more uniformly swept by the electron ribbon beams than was achieved with the prior irradiation method and devices.

These and other objects, aspects, advantages and features of the present invention will be more fully understood and appreciated upon consideration of the following detailed description of a preferred embodiment, presented in conjunction with the accompanying drawings.

BRIEF DESCRIPTION OF THE DRAWINGS

In the Drawings:

FIG. 1 is a highly diagrammatic overview of two stage in-line particle beam generators in accordance with the principles of the present invention.

FIG. 1A is a highly schematic cross-sectional view of an elongated, curved transmission window for use within one of the FIG. 1 particle beam generators for irradiating a strand.

FIG. 2 is a highly diagrammatic view of a two stage coaxial electron beam generator in accordance with the principles of the present invention, omitting structural elements so as to add clarity of explanation.

FIG. 3 is a more detailed structural block diagram of the FIG. 2 generator.

FIG. 4 is a front view in elevation and section of one apparatus embodying the FIG. 2 electron beam generator.

FIG. 5 is a left side view in elevation and section of the FIG. 4 embodiment.

FIG. 6 is a front view in elevation of an electron beam vacuum chamber of the FIG. 4 embodiment.

FIG. 7 is a left side view in elevation of the FIG. 5 vacuum chamber.

FIG. 8 is a greatly enlarged view of a sectioned portion of one converging magnet pole and the electron beam tubular window of the FIG. 4 embodiment, with the vacuum chamber portion at the window region depicted in section.

FIG. 9 is a left side view in elevation of fluid coolant jackets for the vacuum chamber of the FIG. 4 embodiment.

FIG. 10 is a right side view of the coolant jackets of the FIG. 4 embodiments.

FIG. 11 is a front view of the FIG. 10 coolant jackets.

FIG. 12 is a view in elevation and section of one of the electron gun assemblies of the FIG. 4 embodiment.

FIG. 13 is a plan view of the FIG. 12 electron gun assembly.

FIG. 14 is a detailed view of the filament structure of the FIG. 13 electron gun assembly with the aperture structure shown only by broken lines, thereby showing the underlying filament arrangement.

FIG. 15 is a detailed view in section of the filament aperture structure of FIG. 13, taken along the line 15—15 in FIG. 13.

FIG. 16 is a somewhat diagrammatic view in elevation of the structure of each of the electron beam accelerator units of the FIG. 4 embodiment.

FIG. 17 is an overview electrical block and schematic diagram of a driving circuit for generating driving currents for the deflection and convergence magnets of the FIG. 2 coaxial electron beam generator.

FIG. 18 is a detailed electrical schematic circuit a deflection magnet AC clipper regulator circuit diagram of element of the FIG. 17 driving circuit.

FIG. 19 is a detailed electrical schematic circuit diagram of a convergence magnet AC clipper regulator circuit element of the FIG. 17 driving circuit.

FIG. 20 is a detailed logic circuit diagram of a fifty to one counter circuit element of the FIG. 17 driving circuit.

FIG. 21 is a simplified wiring diagram illustrating the provision of a current bucking loop provided within the FIG. 2 coaxial electron beam generator in order to minimize electromagnet current crosstalk and resultant waveform distortion resulting therefrom.

FIG. 22 is an electrical schematic circuit diagram showing how the mutual inductance coupling between the scan and convergence magnets presented by the vacuum housing and other structure of the coaxial electron beam generator is cancelled out by provision of the bucking loop shown in FIG. 21.

DETAILED DESCRIPTION OF A PREFERRED EMBODIMENT CONCEPTUAL OVERVIEW

In order to realize efficiency with a single pass irradiation process for a workpiece such as small diameter, or limited cross-dimension, continuous strands, and the like, it is most desirable to position the irradiation window as close as possible to the workpiece. Close proximity of the energy transmission window to the workpiece minimizes the loss of useful beam current experienced when a particle beam encounters angular scattering upon traversing the window media and scattering energy losses due to collisions with air molecules in the ambient environment between the window and the workpiece.

In one specific example, efficiency of an irradiation process may be described as a constant (e.g. 0.93) times a ratio of the diameter of a workpiece strand over the diameter of a tubular window. In this example, if the irradiation window diameter approached the diameter of the strand, the irradiation efficiency would approach 93 percent. (This relationship assumes a given, non-varying thickness of window material).

In order to realize an improvement in irradiation uniformity and concomitant efficiency in irradiation process throughput, the irradiating beam should enter the workpiece strand substantially uniformly about its circumference. Preferably the window is curved and more preferably it is annular. However, it is to be understood that with appropriate placement of a plurality of accelerators, a flat window can be utilized, if desired. As an annular window becomes smaller, for a fixed beam current, the window loading (heating) increases, since the area of beam impingement is reduced. At very high window temperatures, material creepage due to the stresses of the differential pressure across the foil will result in window failure due to implosion, or in extreme cases due to ignition of a window of titanium foil material, for example.

While the prior art teachings have solved window loading limitations by increasing window surface area (typically by making a planar window longer and longer), such approach does not result in uniform irradiation of the workpiece, and it does not work well with particle beams of lower energy.

It has been discovered that the formation of a transmission window following an elongated, curved geometry having a radius of curvature smaller than the transverse window dimension, together with the application of a longitudinally, cyclically swept and converged particle beam having a transverse sweep dimension substantially coextensive with the useable length of the elongated curved window, dramatically overcomes the limitations and drawbacks of the prior art and achieves a breakthrough in irradiation technology.

First, the curved window may be made very thin and possess very advantageous beam transmission characteristics while remaining quite strong mechanically, due to the low hoop stress which characterizes small radius of curvature geometry. Reduction of the window thickness advantageously reduces the beam energy losses within the window and window exit scattering angle of the beam. Reduction in beam energy losses also results in reduced window loading (heating). These effects are significant in that the prime cost of the irradiation beam generator accelerates non-linearly as the particle energy and current parameters are increased.

Second, the radius of curvature of the curved window may approach the radius of the strand workpiece, thereby increasing irradiation efficiency of the beam entering the exposed outer surface area of the strand. By cyclically sweeping the beam and converging it upon the active area of the curved window, the entire active area of the curved window may be much more efficiently and uniformly irradiated.

Third, the heat from window loading due to radiation flux may be efficiently and effectively removed from the window by convection to an adjacent airstream or other fluidic cooling medium preferably carrying an evaporation agent, such as atomized moisture, and passing with the workpiece adjacent to the active area of the curved window. Effective cooling by convection to the cooling medium and by the heat of vaporization of the evaporation agent enables the window to tolerate higher radiation loading. This higher heat dissipation factor enables higher beam currents to be used than otherwise.

Thus, practice of the present invention enables the effective and efficient use of a lower power, lower cost, portable irradiation beam generator for improved, more uniform irradiation processing of a workpiece, such as a continuously fed strand. Concomitantly, irradiation beam generators of conventional energies and currents may be adapted and modified to utilize aspects of the present invention with dramatically improved results in terms of workpiece throughput and irradiation efficiency.

OVERVIEW OF DEFLETED AND CONVERGED BEAM ACCELERATORS

The principles of the present invention are illustrated by way of the examples in overview provided by FIGS. 1B, 1A and 2. In FIG. 1B, two in-line swept particle beam accelerators 10 and 10' are provided for irradiation processing of a work piece, such as a moving strand 11, which moves successively through each accelerator. The following description of the accelerator 10 applies with like force to the accelerator 10'. Structural elements performing like functions in the accelerator 10' bear a prime following a reference numeral for the corresponding element of the accelerator 10.

Within the accelerator 10, a particle beam emitter 14 provides a source of emitted charged particles, such as electrons, in a beam. A beam accelerator 16 focuses, directs and accelerates the beam 15 in the direction shown in FIGS. 1B and 1A. A deflection electromagnet having oppositely facing poles 17a and 17b electrodynamically deflects the beam 15 in accordance with an AC beam deflection signal supplied by a deflection magnet driver circuit 18. Near the workpiece 11 a convergence electromagnet having oppositely facing poles 19a and 19b converges the deflected beam toward the workpiece strand 11 in accordance with an AC beam convergence magnet driver 20. A single source 22 supplies AC signals to both the deflection magnet driver 18 and convergence magnet driver 20, so that both the deflection poles 17 and convergence poles 19 define fields which are in synchronism with each other. Electrical circuitry comprising the single source 22 and drivers 18 and 20 within a ribbon beam particle generator embodiment of the present invention is described in greater detail in conjunction with FIGS. 17-22 hereinafter.

As shown in FIG. 1A, an elongated, curved window 24 is held in place between two flanges 26 and 28. The thin foil window material is formed around a curved surface 27 of the upper flange 26 which distributes the stress resulting from pressure gradient existing between a high vacuum interior 12 of the particle beam generator 10 and the ambient environment in which the strand 11 is positioned. The beam 15 is generated within a high vacuum interior of the generator 10. A beam absorption structure 23 is located directly below the window 24 and below the strand 11. The beam absorption structure 23 is preferably fluid cooled and may define a multiplicity of cavities 25 which prevent backscattering and further heating of the window 24.

Cooling fluid, such as pressurized air preferably carrying an evaporation agent such as atomized moisture to the window 24, is directed by a passage 30 and nozzle flange 32 to flow across the outside surface of the window 24 to cool it. This flow of coolant, denoted by short arrows in FIG. 1A, can be directed by suitably configuring the block 23 and other structure so as to create a pressure differential which enables the strand 11 to become centered along a common convergence location at a focal point of the beam 15 in order to increase irradiation efficiency. Such an arrangement is disclosed and described in connection with the patent application first referenced hereinabove.

As shown in FIGS. 1B and 1A, the particle beam 15 may be a highly focused annular spot beam which may be swept along the axial dimension of the window 24 in conventional fashion. More preferably, the particle beam is formed as a ribbon beam, having a beam width fixed in relation to the longitudinal dimension of the window 24.

COAXIAL RIBBON BEAM ACCELERATOR

More preferably, the particle beam is formed as a ribbon beam, having a beam width fixed in relation to the axial dimension of the window 24. Turning now to FIG. 2. one presently preferred embodiment of the present invention is a coaxial ribbon beam generator 40. FIG. 2 depicts the generator 40 in broad functional overview within an application for irradiating a continuously moving strand 11 in a single pass with high energy electrons. While electron ribbon beam bombardment is the presently preferred practice of the generator 40, it will be appreciated by those skilled in the art that the present invention may be satisfactorily employed to irradiate a moving strand by highly energetic ribbon beam ionized particle (positive ion) bombardment.

Within the generator 40, the strand 11 is moving along an axial path which is intersected at an irradiation location 42 by two electron beam ribbons: an upper ribbon beam 43 and a lower ribbon beam 44.

The upper beam 43 is generated by an electron gun assembly 45 which generates, focuses and directs the beam 43 toward the top half of the irradiation location 42, while the lower beam 44 is generated, focused and directed by an electron gun assembly 46 which directs its beam toward the lower half of the irradiation location 42.

While the preferred charged particle beam is described herein as a "ribbon beam", denoting that the beam has a transverse dimension substantially coextensive with the useful area of an irradiation window tube 52 (FIG. 8), it is to be understood that the term "ribbon beam" applies with equal force to an annular spot beam which is additionally deflected back and forth along loci following the window's axial dimension by conventional deflection equipment and techniques, thereby achieving directly an effective "ribbon beam" which is functionally equivalent to the ribbon beams emitted by the electron guns 45 and 46.

After the upper beam 43 leaves the electron gun 45, it traverses a beam acceleration section and then passes through a deflection unit 47 which deflects the beam back and forth over a deflection field for a predetermined deflection amount at a predetermined rate presently preferred embodiment 40, typically about thirteen degrees each side of incidence with the strand 11 and at a predetermined deflection rate of typically about 100 Hz. Similarly, a lower deflection unit 48 sweeps the lower beam 44 back and forth across the same deflection field at the same rate, but in an opposite sense with the upper beam 43. Thus, from a single point of view, when the upper beam 43 is deflected to the left, the lower beam 44 is deflected to the right, and so forth. This opposed phase deflection arrangement of the ribbon beams 43 and 44 is more clearly illustrated in FIG. 3.

The two beams 43 and 44 enter a powerful magnetic convergence field generated by a central convergence electromagnet 49 which dynamically redirects and converges the two beams 43 and 44 onto opposite side portions of the strand 11 throughout the range of deflection of the beams. The convergence unit 49 operates dynamically in synchronism with the two deflection units 47 and 48. With this swept and converged beam approach, each deflection/convergence cycle causes the two beams 43 and 44 to sweep across and irradiate substantially the entire cylindrical surface of the strand 11 at the irradiation location 42.

After convergence, the ribbon beams 43 and 44 have an angle of incidence relative to the elongated strand which is approximately perpendicular, throughout the sweep cycle, from direct in-line incidence from the electron guns 45, 46, to approach ninety degrees on each side of in-line incidence, as shown in FIG. 2. By "approximately perpendicular" is meant an angle of incidence of the electron beam which varies from perpendicular by no more than plus or minus 40 degrees at the worst case during the sweep (ninety degrees each side of in-line incidence).

By adjusting the beam energy (kilovoltage) and beam intensity (current), by regulating the sweep/convergence field intensities and sweep frequency in relation to forward travel of the strand 11, and by effectively cancelling out the effects of any undesired magnetic circuit coupling loops presented by the accelerator structure as described hereinafter in conjunction with FIGS. 21 and 22, a precise, uniform dosage may be continuously administered to the strand, thereby to crosslink or modify, heat or otherwise treat the materials thereof.

WINDOW GEOMETRIES

By providing two ribbon electron beams 43 and 44 which periodically sweep across the entirety of usable surface of the irradiation location, a very thin, yet structurally strong tubular beam window, such as the window 52 depicted in FIG. 8, may be employed so that a higher fraction of total radiation energy continuously impinges upon the strand or workpiece 11 than heretofore attainable with prior methods, without undue heating of the window.

It will be immediately appreciated by those skilled in the art that the electron gun and the paths followed by the ribbon beams 43 and 44 are contained within a highly evacuated chamber which includes the electron guns 45 and 46 and which also includes a beam deflection manifold, such as the manifold 64 illustrated in FIGS. 4, 5, 6, 7 and in part in FIG. 8, for example. The manifold 64 provides a suitable high vacuum mounting for the tubular window 52 at the central irradiation location 42 (see FIG. 2).

The window 52, depicted most clearly in FIG. 8, is preferably formed as a very thin (0.0005" to 0.0015") foil of titanium alloy (3% aluminum and 2.5% vanadium), for example, which has been rolled into a tube and then butt-welded e.g. by laser welding into a continuous tube which is free of pinholes and other structural defects. The tubular window 52 is given an axial length in relation to the transverse (cross) dimension of the ribbon beams 43 and 44. The window 52 thus formed passes the electrons of the ribbon beams 43 and 44 to the strand 11 with minimal scattering and minimal generation of x-rays.

If x-radiation is desired, the thin titanium foil window may be replaced with a thicker x-ray transmission target formed of a suitable high atomic number material, such as 0.010" thick tungsten, for example. The substitution of a higher atomic number target material for the window 24 (FIG. 1A) or the window 52 (FIG. 8), together with the provision of a beam having sufficient energy and intensity, results in an efficient x-ray generator providing x-radiation energy focused toward the longitudinal axis of the cylindrical passageway defined by the x-ray transmission target.

As already suggested hereinabove, in the event that a single beam irradiation system is contemplated, the tubular window 52 may be replaced by a semicylindrical window having its convex surface area facing the single beam emitter as is shown in FIG. 1A. A suitable mounting and vacuum sealing arrangement is provided to form the thin foil sheet of window material, e.g. titanium alloy foil, into the semicylindrical geometry depicted in cross-section in FIG. 1A which manifests significantly lower hoop stress, as does the tubular shape of the window 52 shown in FIG. 8.

WINDOW COOLING

Since electron bombardment of the foil window 52 will result in heating, an airflow fitting 33 is provided to direct pressurized airflow from a source thereof (not shown) as an outer annulus through the ambient interior passageway extending through the tubular window 52. This cooling airflow not only removes heat built up within the window 52 by convection, it also advantageously creates a lower pressure region along a central axis, thereby aiding in guiding the strand 11 through the tubular window 52.

The limit of power loading of the foil window 52 can be defined to be that amount of thermal load that a transmission window can withstand without weakening to the point of failure. For a window made of titanium foil alloy the electron energy loss in the window is approximately 20 KeV per one thousandth inch of window thickness. Therefore, the power dissipated in a window structure, such as the tubular window 52, is the product of the energy loss and the electron beam current passing therethrough.

One limitation upon window power loading stems from the inefficiency of heat transfer from the window structure to the cooling fluid medium, typically high velocity air, passing over the active surface area of the window which is exposed to the ambient environment.

The thickness of an air flow boundary layer which forms adjacent to the window surface represents an insulating layer, limiting heat transfer to the cooling fluid medium.

A small amount of an evaporation medium, such as distilled water, entrained in the cooling air stream has been discovered to have not only the expected effect of removing heat from the window but also the unexpected effect of creating tiny droplets and rivulets of water on the window which result in turbulence during evaporation which actively promote breakup of the air flow boundary layer, thereby further enhancing convective flow cooling.

It has been found that a water to air parts of water per 10,000 parts of air by volume has achieved the results described immediately above. A less precise approximation of this ratio is about 200 drops of water for each five standard cubic feet of air. The moisture is preferably injected into the airstream in such a manner that it is carried directly to the active surface area of the tubular window 52.

The amount of localized heating capable of being tolerated by the tubular window 52 effectively limits the intensity of the electron beams 43 and 44. However, since the two ribbon beams 43 and 44 sweep across the entire surface of the window 52, localized heating is intermittent and uniform.

ACCELERATOR SYSTEM STRUCTURE

Turning now to FIG. 3, the generator 40 is shown in structural overview. The upper electron gun 45 includes an elongated electron emitter 50$a$, $b$ (FIGS. 13-15) which has a length defining the transverse dimension of the upper ribbon beam 43 and necessarily the minimum transverse dimension of the deflection manifold 64. The lower gun 46 includes an electron emitter 51$a$, $b$ identical with the emitter 50$a$, $b$. Both emitters are aligned with the strand 11. The length of the emitter pairs 50$a$, $b$ and 51$a$, $b$ is approximately two inches, for example, which dimension matches approximately the active area axial length of the tubular window 52.

In preferred form, the emitters 50$a$, $b$ and 51$a$, $b$ are formed as direct parallel filament heaters which are heated by independently controllable filament transformer power supplies 72 and 74. Other forms of emitters, such as indirectly heated cathodic emitters, may be employed with satisfactory results.

After leaving the emitter 50$a$, $b$, the upper beam 43 passes through a controllably biased, elongated box-shaped focus electrode 53 which shapes and focuses the ribbon electron beam 43 and an accelerator unit 54 which accelerates and maintains shaping of the beam 43 which is then directed toward the convergence location 42. The accelerator unit 54 (shown in greater detail in FIG. 16) is comprised of a plurality of electrically graded dynode rings 55. A resistance ladder network 56 provides a predetermined voltage to each of the rings 55 of the accelerator across a voltage gradient extending between the negative high voltage applied from the generator 66 to the emitter structure and ground or chassis potential. (The strand 11 is effectively at the window potential (nominally grounded) and is travelling at sufficient velocity to carry away the electrostatic charge in order to prevent excessive buildup of electrostatic voltages.) That part of the resistor ladder network 56 which is connected between the electron gun and the focus lens also provides a convenient source for supplying an adjustable bias voltage for the box-shaped focus electrode 53.

A lower beam accelerator unit 57, structurally and functionally identical with the upper unit 54, focuses the lower beam 44 and directs it upwardly toward the convergence location 42.

The upper deflection unit 47 is comprised of an electromagnet having poles 58 and 59 oppositely facing the beam 43. As the beam 43 passes through the unit 47, a time varying magnetic field developed across the poles 58 and 59 causes the beam to be deflected back and forth. Similarly, the lower deflection unit 48 deflects the lower beam 44 back and forth in a directional sense opposite to the directional sense of the upper deflection unit 47. The electrodynamic deflection units 47 and 48 include coil windings which are powered by driving currents supplied by a beam deflection generator and driver unit 68. This driver unit 68 also supplies driving current to the convergence unit 49 in phase synchronism with the driving currents supplied to the deflection units 47 and 48.

Generally triangular 100 Hz driving current waveforms are generated by the generator unit 68. These drive signals are amplified within the generator unit 68 and are applied to the deflection units 202 and 204 and to the convergence unit 206, so that the scans of the beams 43 and 44 across the tubular window 52 (not shown in FIG. 3) maintain a substantially uniform rate.

The deflection amplifier units 202, 204 (see FIG. 17) are preferably implemented with Model 3010-LS single axis DC linear servo amplifiers made by Aerotech, Inc., Pittsburg, Pa., or equivalent. This model linear servo amplifier is capable of generating a peak driving signal at ±30 volts and 10 amps. The convergence amplifier unit 206 (see FIG. 17) is preferably implemented with a Model 16030-V single axis DC pulse width modulated ("PWM") servo amplifier, also made by Aerotech. This amplifier has the capability of putting out a peak driving signal of ±160 volts at 30 amps.

In operation, the magnetic flux intensities vary substantially linearly between the extremes of the range thereof. Both deflection electromagnets 47 and 48, and the convergence electromagnet 49, operate in a generally linear magnetic flux region well below core saturation.

Negative high voltage is generated by the high voltage generator 66 and supplied to the heater pair 50$a$, $b$ via a high voltage path. High voltage supplied to the upper heater pair 50$a$, $b$ is also supplied to the lower heater pair 51$a$, $b$ via a high pressure coaxial conduit 96 within the unit 40 as described with greater particularity hereinafter.

HIGH VOLTAGE ISOLATION FILAMENT TRANSFORMERS

An emission control circuit 70 supplies power to the primaries of two toroidal isolation filament transformers: an upper transformer 72 and a lower transformer 74. Variable primary voltage may be supplied from a computer controlled, step motor operated autotransformer, such as a Variac (tm). Secondary windings of the transformers 72 and 74 provide low voltage at high current to the heater pairs 50$a$, $b$ and 51$a$, $b$ respectively. The voltage isolation between the primary winding and the secondary winding of the transformers 72 and 74 exceeds 500,000 volts. Thus, the AC voltages supplied to cause the heater pairs 50$a$, $b$ and 51$a$, to heat (the heaters being at very high negative voltage levels on the order of 150,000 to 500,000 volts preferred range) may be easily adjusted and regulated by controlling the ac power supplied to each primary winding operating at ground or chassis potential with respect to the high voltage supply 66. (Higher potentials, e.g. up to one million electron volts, may be advantageously employed in suitably sized and shielded equipment following the principles of the present invention.)

A primary core is preferably formed of a spiralwinding of 0.030" by 1.75" hydrogen-annealed electrolytic iron tape spiral-formed into e.g. 31 turns which are separated by a suitable insulation material to minimize eddy current losses. The core dimensions are 6.5" inside diameter and 8.5" outside diameter. The core is covered with a cut-through resistant paper and fiberglass tape prior to winding the primary winding. The primary winding consists of e.g. 500 turns of 18 gauge enamel-insulated copper wire evenly wound around the annular extent of the toroid core. A fiberglass tape covers the primary winding.

The primary is secured in position by cable ties to a suitable mounting substrate, such as one or two sheets of plastic. The secondary winding is formed as a single helical coil of two strands of 13 gage enamel-insulated wire having an inside diameter of eight inches. The secondary winding includes 23 turns which are tightly wound together in position over the primary winding. The secondary winding is held in position so that no part of the secondary winding is substantially closer than about two inches to the primary winding. The secondary winding may also be secured in position to a plastic panel secured to a high voltage filament terminal. The secondary winding may be secured to the high voltage graded plastic panel by cable ties. The plastic panels supporting the primary and secondary windings are not in contact with each other, thereby eliminating any solid dielectric paths between the primary and the secondary windings. With this arrangement, sufficient current may be delivered to excite the emitters 50a, b, and 51a, b, and still provide the requisite high voltage isolation between primary and secondary within the highly insulative sulfur hexafluoride environment of the chambers 90 and 95 (see FIG. 4).

CONTROL CIRCUITS

A strand velocity control circuit 76 controls the feed rate of the strand 11 by controlling capstans 77 and 78 which guide and move the strand 11 through the convergence unit 49 and window 52, typically in a single pass. The actual velocity of at least one of the capstans 77 or 78 is monitored by the velocity control circuit 76 in order to be sure that the irradiation process results in application of the specified radiation dosage to the strand 11.

A temperature sensing and cooling control circuit 79 monitors temperatures throughout the system 40 and particularly at the vicinity of the window 52, and controls airflow through the central tubular passage defined by the window 52 (FIG. 8) and waterflow passing through water jackets for cooling various parts of the system 40, as will be explained in greater detail hereinafter.

A beam current sensing circuit 80 includes an upper beam excited sense toroidal transformer pair 81 located along the ribbon beam path between the accelerator tube 54 and the upper deflection electromagnet 47 and further includes a lower beam excited sense toroidal transformer pair 83 located along the lower ribbon beam path between the accelerator tube 57 and the lower deflection coil 48. Each toroid sense transformer pair 81, 83 includes two series connected, reversed phase toroidal windings wound around saturable mu-metal cores. An AC excitation voltage is applied to the toroidal transformer pairs 81, 83, and the magnitude of the unidirectional ribbon beams 43 and 44 causes the onset of saturation and coefficient of mutual coupling of each toroidal transformer coil pair to vary thereby enabling direct sensing and very accurate measurement of beam current magnitude. This sensing methodology separately measures each beam 43 and 44, and enables precise feedback control of each beam at the emission control 70.

A programmed control and status computer 82 is connected to the high voltage generator 66, beam deflection generator 68, emission control 70, velocity control 76, temperature control 79, and beam current sensing circuit 80 via a bidirectional control and monitor path 84. The computer 82 monitors and records in a memory the various parameters of the irradiation process carried out by the system 40, carries out calculations related thereto including the derivation of dosage values applied to a particular strand, and displays process control information and error condition messages to operators monitoring the process via a suitable display device, not shown. A keyboard, also not shown, enables an operator to enter process control parameters and diagnostic commands and inquiries. A printout device, not shown, provides a hard-copy printout of parameters recorded and calculated during a process as a production record associated with the particular strand 11 undergoing irradiation processing.

The computer 82 is preferably implemented as an IBM Personal Computer XT (tm), or equivalent, which is equipped with a fixed disk mass storage subsystem with a suitable disk operating system, such as DOS, and an RS-422 interface expansion card enabling connection to four daisy-chained Opto-22 Optomux "Brainboard" controllers, each providing up to sixteen analog or digital inputs and/or outputs. One board provides up to 16 analog inputs which are addressed at I/O address 110, another provides up to 16 analog outputs which are addressed at I/O address 100, a third provides up to 16 digital inputs which are addressed at I/O address 255, and the fourth provides up to 16 digital outputs which are addressed at I/O address 254.

Port assignments are as follows:

| Port No. | Function |
|---|---|
| Analog Inputs: | |
| 0 | High Voltage Sense |
| 1 | Beam 43 Current Sense |
| 2 | Beam 44 Current Sense |
| 3 | Low Voltage Return |
| 4 | Strand Velocity |
| 5 | Velocity/MA |
| 6 | Vacuum Level |
| 7 | Deflection Frequency |
| 8 | Upper Deflection Magnet Current |
| 9 | Convergence Magnet Current |
| 10 | Lower Deflection Magnet Current |
| 11 | Window Air Temperature |
| Analog Outputs: | |
| 0 | Beam 43 Level Control |
| 1 | Beam 44 Level Control |
| 2 | Strand Velocity Control |
| Digital Inputs: | |
| 0 | High Voltage Status |
| 1 | Beams 43 and 44 Status |

-continued

| Port No. | Function |
| --- | --- |
| 2 | Support Equipment Status |
| 3 | Window Cooling Air Status |
| 4 | Ambient Radiation Hazard Detector |
| 5 | Ambient Radiation Hazard Detector |
| 6 | Sulfur Hexafluoride Pressure Sw. Status |
| 7 | Deflection Magnets Status |
| 8 | Convergence Magnet Status |
| 9 | Cooling Water Flow Status |
| 10 | Interlocks Status |
| 11 | System Reset Status |
| 12 | Strand Handling Equipment Status |
| Digital Outputs: | |
| 0 | High Voltage On-Off |
| 1 | Beams 43 and 44 Enable On-Off |
| 2 | High Voltage Red Panel Lamp On-Off |
| 3 | Beam Current Red Panel Lamp On-Off |
| 4 | High Voltage Ramp Step UP |
| 5 | High Voltage Ramp Step DOWN |
| 6 | Convergence Magnet Power On-Off |
| 7 | High Voltage Command On-Off |
| 8 | Conditioning On-Off |
| 9 | Cooling Water Pump On-Off |
| 10 | Window Cooling Air On-Off |
| 11 | Controls Reset/Emergency Stop On-Off |

The microfiche appendix filed with the application leading to this patent contains a control program written in GW-Basic. The program set forth in the microfiche is preferably compiled with a suitable compiler program before execution to improve execution speed by the computer 82.

In particular, the computer 82 may be programmed to receive as a process preset a charged particle ribbon beam voltage and current for each ribbon beam. (For uniform radiation dosages, the beam currents will nominally be preset to be equal). During irradiation of a strand, the beam current monitor circuit 80 senses and converts to digital values the beam currents of the ribbon beams 43 and 44. Periodically, throughout the irradiation process the computer 82 compares the preset beam currents with sensed real time ribbon beam current and makes any adjustment of beam current by adjusting automatically the primary voltage at the filament transformers 72 or 74 by use of phase angle fired power supplies. The high voltage supply 66 may be similarly controlled by the computer 82.

The computer 82 also senses strand velocity at the capstan 78 via the velocity control 76 and controls the capstans 77 and 78 so as to control the rate at which the strand 11 is drawn through the tubular window 52. In this manner, radiation dosage level and radiation uniformity may be optimized. Alternatively, the velocity control 76 may be used to control the beam current in proportion to measured velocity of the strand 11. The computer 82 also advantageously collects and records radiation dosage values for the strand being irradiated during a radiation interval. These records may be collected and printed out as may be required. This aspect of the computer 82 provides a convenient, automatically gathered, irradiation process record for the strand 11 in question.

The computer 82 also advantageously senses temperature at the vicinity of tubular window 52 via the temperature sense and cooling circuit 79, and compares sensed window vicinity temperature with a preset maximum window temperature. The computer 82 automatically may then stop irradiation processing if the sensed temperature becomes excessive, and/or control flow rate of a cooling fluid passing through the interior of the window 52 via the air fitting 33 in order to keep the sensed window vicinity temperature below the predetermined maximum window temperature. This step extends the life of the very thin window 52 and enables further optimization of the irradiation process.

Also, the temperature at the vicinity of the vacuum chamber 64 is sensed via the temperature sense circuit 79. The computer 82 compares sensed vacuum chamber vicinity temperature with a preset maximum vacuum chamber temperature, and automatically controls flow rate of a cooling fluid passing through cooling jackets (FIGS. 9-11) adjacent to the vacuum chamber 64 in order to keep sensed vacuum chamber vicinity temperature below the maximum vacuum chamber temperature.

GENERATOR STRUCTURAL DETAILS

FIGS. 4 through 16 set forth various views of apparatus embodying and incorporating the principles of the coaxial electron beam generator 40 depicted more conceptually in FIGS. 2 and 3. A housing or frame 73 includes casters 88 mounted to legs 89 so as to be freely moveable and positionable within a manufacturing/processing facility. The casters 88 define circumferential notches and enable the housing 73 to be rolled along guide rails 85 so as to be positioned directly in-line in a manufacturing process and to be positioned off-line for batch processing of previously manufactured strands, such as polymer strand, and for easy access for maintenance, depending upon the needs of the particular manufacturing process.

The box frame housing 73 supports the on-board structural elements of the dual beam generator 40, and it includes sidewalls 86 to form and shield an enclosed space containing the manifold 64 and deflection electromagnets 47 and 48 and the convergence magnet 49. The housing 73 also supports an upper horizontal plate or shelf 98 which is attached and leveled by corner studs and nuts 99 and a lower horizontal plate or wall 100.

A cylindrical upper pressure vessel 90 includes two removeable bulkheads 91 and 92 which close the ends thereof to form an enclosed space. The vessel 90 contains the filament toroidal transformer 72 for powering the upper filament pair 50a, b and also the filament flange 111 and accelerator array 54. An electrical feedthrough fitting 93 enables primary connections to be made to the filament transformer 72 for powering the upper filament pair 50a, b. A vertical tube 94 extends upwardly from the upper cylindrical chamber 90 and provides a suitably insulated connection to a cable leading to the negative high voltage power supply 66.

The upper pressure vessel 90 is supported upon the upper plate 98 by a vertical support tube 106 which mounts directly to the plate 98 and which is welded to the vessel 90 as shown in FIG. 4. The vertical tube 106 is generally concentric with the filament flange 111 and accelerator array 54. A flanged tube 113 is positioned between the lower end of the accelerator unit 54 and the upper flanged end of the of the vacuum chamber manifold 64. The flanged tube 113 contains the current sense toroidal coil pair 81.

The interior of the vessel 90 including the interior of the vertical tube 106 is loaded with a suitable high dielectric insulation gas, such as sulfur hexafluoride, under suitable pressure as is known in the art. This high dielectric gas environment inhibits flash-over at the very high negative voltages present within the interior space of the chamber 90. The filament flange 111 and accelerator unit 54 provide a high vacuum seal between the pressurized interior space of the vessel 90 and the high vacuum of the manifold 64.

The vertically extending, high pressure coaxial conduit assembly 96 extends from the upper pressure vessel substantially identical lower pressure vessel 95 mounted below the lower plate 100. The conduit assembly 96 enables high voltage to be passed to the lower electron gun/accelerator assembly. The pressurized lower vessel 95 is substantially a mirror image likeness of the upper vessel 90 (but without the high voltage connection structure 94). The lower vessel 95 includes two removable end bulkheads 87 and 97, and it contains the toroidal transformer 74 for supplying filament power to the lower direct filament pair 51a, b. The lower vessel 95 also includes a fitting 75 for receiving the filament coil primary power leads. A vertical tube 108 supports the pressurized lower vessel 95 and mounts it to a bottom wall 100 of the support frame 73. The lower filament pair 51a, b and lower accelerator unit 56 are coaxial with the tube 108 and provide a barrier between the pressurized interior of the lower vessel 95 and the high vacuum manifold 64. A flanged extension tube 114 provides a suitable bridge connection between the accelerator unit 56 and the the lower end of the vacuum chamber manifold 64. The tube 114 contains the current sense toroidal coil pair 83.

The upper vessel 90 and the lower vessel 95 are formed of a steel alloy in order to be able to withstand the nominal 80 psi pressure of the sulfur hexafluoride insulator gas contained therein. The upper vessel 90 and lower vessel 95 are rated to about 100 psi.

Four vertical L-shaped posts 102 and cross beams 103 within the interior space defined by the frame 73 define a support grid for supporting the upper deflection unit 47, lower deflection unit 48 and convergence unit 49, as shown in FIGS. 4 and 5. The vacuum chamber manifold 64 is also substantially contained and supported within the box defined by the vertical posts 102. An extension portion 65 of the manifold 64 leads to a turbomolecular vacuum pump assembly 67 which enables evacuation of the interior of the vacuum chamber. Lead bricks attach to the outside walls of the vertical posts 102 and provide part of the shielding needed to contain irradiation within the vertical box region of the vacuum chamber. The bricks 104 bolt onto the posts 102, thereby enabling ready installation and removal so as to provide access to the interior of the box for inspection and maintenance. The walls 86 are preferably formed of lead plates in order to provide additional radiation shielding of personnel in the vicinity of the apparatus 40.

With reference to FIGS. 6 and 7, the vacuum chamber manifold 64 includes a top flange 115, a bottom flange 116 and a side flange 117 leading from the extension portion 65. Two small flanges 118 and 119 are mounted in line with the tubular window 52 and may also provide sight glasses enabling sensing of the temperature or other visual inspection of the window tube 52. Sensed window temperature information may also be provided to the temperature sense and cooling control circuit 79 so that the control and status computer 82 may automatically reduce or cut off beam current should local heating become excessive. Alternatively, the temperature of the cooling gas leaving the interior of the tubular window 52 may be sensed and used to provide an indirect measurement of temperature at the window 52.

Two major surface walls 120 and 121 of the chamber 64 are enclosed by endwalls 124, 125 and 126 to render the interior space sealed. Brackets 122 are stiffeners which enable the thin chamber walls to withstand the differential pressure between internal vacuum and external ambient pressures without undue deformation or deflection.

With reference to FIG. 8 the window 52 is mounted within the interior space of the manifold 64 at the center thereof between two nipples 127 and 128. Threaded caps 129 seal the ends of the tubular thin-foil window 52 to the nipples and enable replacement of the window 52 should it fail in service or require periodic replacement. Also, replacement of the window with an x-ray transmission target is facilitated by the threaded caps 129. A strand guide tube 130 provides a guide for the strand couples directly to the airflow coupling 33. A bracket 132 enables the guide tube 130 and cooling air coupling 33 to be removed to provide access to the nut 129 and nipple 128 for removal/replacement of the tubular window 52. A similar bracket and guide tube is provided on the other side of the manifold 64, although it is not shown in FIG. 8.

As shown in FIGS. 9-11, cooling jackets 134, 136, 138, 140, 142, 144 and 146 cover the exterior surfaces of the manifold in the vicinity of the electron beams 43 and 44 not covered by the magnetic cores of the deflection units 47 and 48 and the convergence unit 49. A cooling fluid, such as water, is circulated through the cooling jackets 134-146 in order to draw away heat generated at the manifold 64 as the result of impingement of the highly energetic electron beams contained therein.

ELECTRON BEAM EMITTER STRUCTURE

With reference to FIGS. 12-15, the assembly for mounting each emitter structure 45, 46 includes the vacuum mounting flange 111 which includes a series of peripheral openings 171 enabling the flange 111 to mount directly to the high voltage end flange 170 of the accelerator array 54 in a vacuum sealing arrangement. Two holes 150 and 152 are defined through a central region of the flange 111 and they receive two electrical feedthrough insulator fittings 154 and 156 which pass conductors 155 and 157 leading from the secondary of the toroidal transformer 72 to the emitter 45 to deliver heater current to opposite ends of the elongated parallel filament pair 50a, b or 51a, b, as shown in FIG. 14. The other end of the elongated filament wire is connected to the flange 111 via a tensioning spring 165. Each tensioning spring 165 accommodates approximately 0.020" thermal linear expansion of the filament strand 50a or 50b. Each filament strand 50a, 50b, 51a, 51b is 0.015" thick tungsten.

An aperture base 158 is formed as a disk with a narrow central rectangular opening 159. Two L-shaped aperture shutter plates 160 and 162 are positioned within the opening 159. The plate 160 has a portion 161 which extends downwardly on one side of the filament 50, 51, and the plate 162 has a portion 163 which also extends downwardly on the other side of the filament. The oppositely facing portions 161 and 163 define an angle of illumination, alpha, as shown in FIG. 15.

The aperture base 158 and the shutter plates 160 and 162 are formed of 0.005" thick electrolytic iron to shunt any magnetic fields associated with the current passing through the filament strands 50a, b, and 51a, b. By arranging the two filament strands 50a and 50b to be symmetrical and closely spaced apart in a parallel arrangement, and by connecting them as shown in FIG. 14, the fluctuating magnetic fields otherwise resulting from alternating current flow through each filament are phase cancelled along an imaginary center line between the two filaments 50a, 50b. This imaginary center line becomes a virtual emitter location for the ribbon beam 43. Thus, the beam 43 carries less than ±10 percent modulation resulting from magnetic fields generated by the AC filament currents. In this manner, the beam currents of the ribbon beams 43, 44 may easily be adjusted by adjusting the primary voltage applied to the filament transformers 72 and 74 with little adverse consequences resulting from AC excitation of the symmetrical parallel filament pair 50a, 50b (and 51a, 51b). If desired, the filament power supply can be modified to supply rectified and filtered DC current to operate the filament pairs 50a,b and 51a,b, for further reduction of beam modulation.

The parallel filament pair 50a and 50b is recessed 0.075" below the face of the aperture base 158 as seen in FIGS. 12 and 15. Two aperture end plates 164 and 166 establish the transverse (cross) dimension of the electron beams 43, 44 as emitted by the filament pairs 50a, b and 51a, b. The end plates 164 and 166 may be adjusted so as to vary the beam width as emitted by the particular filament 50a,b or 51a,b. Preferably, the beam width is limited to about 1.75".

BEAM ACCELERATOR UNITS

FIG. 16 depicts in greater structural detail the structurally identical accelerator units 54, 57. Each accelerator unit 54, 57 includes an upper flange 170 which mates to the filament flange 111 and a lower flange 172 which mounts to the flange of the extension tube 113. A series of 18 annular dynode rings 55, are positioned between the flanges 170 and 172 in vacuum sealing relation therewith. Suitable insulator seals separate each ring from adjacent rings above and below. Each dynode ring 55 includes an inner annular cup portion 174. The box shaped focus element 53 is positioned within the accelerator units 54 and 57, and is attached to a selected one of the dynode rings in order to be at its potential relative to the negative high voltage and chassis ground.

The voltage divider network 56 is formed of a series of high value (10 megohm, 2 watt carbon composition) resistors which are spiralled around the dynode rings 55. Some of the resistors of the network 56 are intentionally omitted in FIG. 16 for clarity. The rings 55 have tap points 176 which provide a predetermined voltage connection from the resistance network 56 to each ring 55. Thus, as the rings 55 extend from the top flange 170 to the bottom flange 172, the voltage applied to each particular ring is dependent upon the tap location and ranges between the minus high voltage applied to the filament pair 50a, b and 51a, b, and the ground potential of the tubular window 52 and strand 11.

DEFLECTION AND CONVERGENCE MAGNET DRIVERS

With reference to FIG. 17, the circuit elements making up the beam deflection generator and drivers section 68 depicted in FIG. 3 is depicted in greater structural detail. Therein, the upper deflection magnet 47 is driven by a linear servo amplifier 202, and the lower deflection magnet 48 is driven by a linear servo amplifier 204. The amplifiers 202 and 204 implemented as single axis, DC, linear servo amplifiers, such as the Aerotech, Inc., Model 3010-LS, noted above, or equivalent. The convergence magnet 49 requires a higher power source, which is provided by a pulse width modulated amplifier 206, implemented for example with an Aerotech, Inc., Model 16030-V PWM servo amplifier, noted above, or equivalent.

As is shown schematically in FIG. 17, control of the magnitude of the deflection fields put out by the deflection electromagnets 47 and 48, and the convergence field put out by the convergence magnet is handled ahead of the driving amplifiers 202, 204 and 206. Those skilled in the art will remember that the magnet drive current (being a recirculating current within an LCR type circuit) is composed of real and reactive components. With moderately efficient circuit elements, the real current component is significantly less than the reactive recirculating current component. Therefore, it is most advantageous to regulate only the real current ahead of the outside of the circulating current loop comprising the windings of the electromagnets 47, 48 and 49, their respective drive amplifiers 202, 204 and 206, and their respective filter capacitors 214, 222 and 230.

Another design aspect of the control circuitry depicted in FIG. 17 is further to isolate the regulator element from power-up/power-down transients by regulating the supply voltage in each instance before it is applied to bridge rectifiers 212, 220 and 228. In order to achieve this control methodology, clipping-type regulation has been applied by the circuits 210, 218 and 226 to the AC voltage supplies feeding the full wave rectifiers 212, 220 and 228. It has been discovered that this technique complements the DC filtering supplied by the capacitors 214, 222 and 230 through significant ripple rejection on the flat top portion of the clipped AC waveforms put out by the circuits 210, 218 and 226. Synchronism between the deflection fields of the deflection magnets 47 and 48 and the convergence field of the convergence magnet 49 requires that each magnet current supply ripple be less than about one percent of the peak current value. These control techniques, explained above, together with phase lock supplied by a fifty to one counter 232 satisfy this stringent ripple control requirement in an efficient, economical manner.

With respect to the generator/driver for the upper deflection electromagnet 47, a line transformer 208 provides AC mains power at a suitable voltage and current to an AC clipper regulator circuit 210. The circuit 210 generates and puts out a clipped sinusoidal AC signal to a full wave diode bridge rectifier 212 which rectifies the AC signal. A filter capacitor 214 filters the DC signal which is supplied to the linear servo amplifier 202.

With respect to the generator/driver for the lower deflection electromagnet 48, a line transformer 216 provides AC mains power at a suitable voltage and current to a second AC clipper regulator circuit 218. The circuit 218 generates and puts out a clipped sinusoidal AC signal to a full wave diode bridge rectifier 220 which rectifies the AC signal. A filter capacitor 222 filters the DC signal which is then supplied to the linear servo amplifier 204. Further details of the first and second AC clipper regulator circuits 210 and 218 are given in FIG. 18.

With respect to the generator/driver for the convergence electromagnet 206, a line transformer 224 provides AC mains power at a suitable voltage and current to a third AC clipper regulator circuit 226. The circuit 226 generates and puts out a clipped sinusoidal AC signal to a full wave rectifier 228 which rectifies the AC signal. A filter capacitor 230 filters the DC signal which then supplied to the PWM servo amplifier 206. Further details of the third AC clipper regulator circuit 226 are given in FIG. 19.

The PWM amplifier 206 also puts out a 5 kilohertz square wave reference signal on a line 231 leading to a fifty to one divider logic circuit 232 which divides the 5 kilohertz signal into a 100 Hz square wave signal and puts out this signal over a line 233 to the input of amplifiers 202, 204 and 206 in order to provide common mode rejection of the 5 KHz switching signal used in the PWM servo amplifier 206 at the deflection amplifiers 202 and 204. Thus, the switching frequency employed by the high power PWM servo amplifier 206 is made to be phase coherent with the driving signals entering all of the amplifiers 202, 204 and 206 without requiring more complicated phase locked loop techniques.

With reference to FIG. 18, the full wave AC clipper regulator circuits 210 and 218 include the transformer 208, 216 which is actually a part of the Aerotech 3010 linear servo amplifier. A secondary winding having a grounded centertap leads to a network of four voltage regulators 236, 238, 240 and 242. The regulators 236 and 240 are positive voltage regulators relative to ground potential, and the regulators 238 and 242 are negative voltage regulators relative to ground potential. An operational amplifier 244 has voltage control outputs leading to control nodes of the positive regulators 236 and 240 and controls clipping level of the positive half cycle from the transformer 208 (or 216). An operational amplifier 246 has voltage control outputs leading to control nodes of the negative regulators 238 and 242 and thereby controls clipping level of the negative half cycle from the transformer 208, 216. A common control potentiometer 249 connected in a voltage divider network supplying the inputs of the clipping control circuits 244 and 246 establishes the clipping levels for both the positive and negative half cycles, thereby providing a symmetrically clipped waveform on two output lines 248 and 250 leading back into the Aerotech servo 1 amplifier 202, 204.

The clip level adjustment (e.g. ±18 volts to ±30 volts) provided by the potentiometer 249 which varies the duty cycle of the drive voltage supplied to the amplifiers 202 and 204 is the primary mechanism for adjusting the deflection drive currents supplied to the deflection magnets 47 and 48 and thereby the degree of deflection of the ribbon beams 43 and 44, as the servo amplifiers 202 and 204 are set to operate at full gain.

With reference to FIG. 19 the circuitry comprising the full wave AC clipper regulator circuit 226 for regulating the PWM servo amplifier 206 driving the convergence magnet is depicted in schematic circuit detail. The circuit is very similar to the FIG. 18 circuit, except that the driving levels are higher. There are two positive regulator 252 and 254. The regulator 252 has two external current pass transistors 256 and 258, and the regulator 254 has two external current pass transistors 260 and 262. There are two negative regulators 264 and 266. The regulator 264 includes a current pass transistor 268, and the regulator 266 includes a current pass transistor 270.

A positive clip amplifier circuit 272 provides a positive clip level control voltage to control nodes of the positive regulators 252 and 254, and a negative clip amplifier circuit 274 provides a negative clip level control voltage to control nodes of the negative regulators 264 and 266. A common control potentiometer 276 within a voltage divider network at the inputs of the control amplifier circuits 272 and 274 sets positive and negative clip levels. The full wave clip-level-regulated driving signal is sent to the input of the PWM servo amplifier over lines 278 and 280.

The clip level adjustment provided at the potentiometer 276 is the primary mechanism for adjusting the driver current supplied to the convergence electromagnet 49 from the PWM servo amplifier 206 as that amplifier is nominally set at full gain. A solenoid controlled double throw, double pole switch 272 provides a one second time delay action and thereby enables the circuit 226 to be initially switched out of the path from the AC mains to the amplifier 206, to prevent power-up current surge from damaging circuit components.

In the presently preferred embodiment, the control computer 82 controls directly the activation of the amplifiers 202, 204 and 206, and the deflection and convergence currents (and resultant fields at the electromagnets 47, 48 and 49) are preset by manual adjustment of the potentiometers 249 and 276. Should direct control of deflection current and convergence current at the electromagnets 47, 48 and 49 be desired, the variable control function provided by the potentiometers 249 and 276 may readily be performed by suitable digital to analog converters whose structures and modes of operation are readily known to and understood by those skilled in the art.

The fifty to one divider circuit 232 is shown in the logic circuit diagram of FIG. 20. Therein, a 5 kilohertz AC signal taken from within the amplifier 206 enters a voltage comparator circuit 286 which processes the AC signal into a square wave. The square wave output then feeds the input of a first four bit binary counter within a dual counter package 288. The input to a second four bit binary counter within the package 288 is fed from a JK flip-flop 284.

A NAND gate 287 has one input from the low bit output of the second counter and another input from the high bit output of the first counter. The output from the NAND gate 287 passes through an inverter 289 to one input of a NAND gate 290, the other input coming directly from the output of the comparator 286. The output from the NAND gate 290 comprises the input signal divided by approximately fifty, (i.e. a 104hz square wave).

An inverter 292 inverts the output from the gate 290 and supplies that signal to reset both of the counters of the package 288. A reset logic array for the JK flip-flop 284 includes gates 294, 296, 298 and 300 configured as shown in FIG. 20.

The 100 Hz output from the gate 290 is shaped into a square wave by passage through a flip-flop 302 and then buffered by passage through a buffer amplifier 304, and buffer drivers 306, 308 and 310 before delivery respectively to the amplifiers 202, 204 and 206.

Thus, the logic circuitry 232 of FIG. 20 achieves a state machine for dividing the approximately 5 kilohertz signal from the PWM servo amplifier 206 down to approximately 100 hz in a simple yet effective manner to provide a phase coherent driving signal to the amplifiers 202, 204 and 206 and at the same time to sync-lock the driving signal to the switching frequency of the high power pulse width modulated servo amplifier 206 thereby to minimize 5 kilohertz ripple in the 100 hz driving current put out by the convergence amplifier 206.

With reference to FIG. 21, those skilled in the art will appreciate that the vacuum manifold 64 and the frame 73 of the coaxial beam generator 40 have the electrical consequence of presenting a single turn coupling loop between the deflection magnets 47 and 48, and the convergence magnet 49. The consequence of this single turn coupling loop is that when the synchronized currents in the convergence magnet 49 reach the greatest amplitude, those currents are induced into the deflection magnets 47 and 48, resulting in distortion of the deflection fields and consequent misdirection of the ribbon beams 43 and 44.

In order to cancel out the coupling loop resulting from the manifold 64 and frame 73 with its attendant cross talk and waveform distortion, without employing an electromechanical mechanism for breaking up the loop with non-conductive materials, a bucking loop 320 formed of e.g. 10 gauge solid copper wire is threaded through and around the cores of the electromagnets 47, 48 and 49 in a manner which effectively cancels out the fields resulting from current flow through the manifold 64 and frame 83. While this approach results in some current losses in terms of electric heating of the bucking loop 320 and electric heating of the manifold 64 and frame 73, the servo amplifiers 202, 204 and 206 have been sized to provide sufficient capacity so that this heating does not detract from the operation of the generator 40. FIG. 22 sets forth an electrical equivalent circuit of the simplified physical structure diagram set forth in FIG. 21.

Having thus described an embodiment of the present invention, it will now be appreciated that the objects of the invention have been fully achieved, and it will be understood by those skilled in the art that many changes in construction and widely differing embodiments and applications will suggest themselves without departing from the spirit and scope of the invention, as more particularly defined by the following claims. For example, the dual, oppositely facing beam emitter assemblies may be replaced by a single particle beam so that the single ribbon beam may periodically sweep across substantially the entirety of the area of a semi-cylindrical irradiation window characterized by reduced hoop stress in accordance with the principles taught hereinabove. A tubular window may be employed in a single beam irradiator in which the deflection and convergence units are modified so that the beam sweeps over substantially the entire useful area of the window tube. An annular or spot beam may be used in lieu of a ribbon beam, and additionally conventionally scanned along the longitudinal dimension to cover the same area covered by a ribbon beam without longitudinal scanning. Also, the principles of the present invention apply with equal force to other highly energetic charged particle beams and acceleration, deflection and convergence systems, including positive particle accelerators. The disclosures and the descriptions herein are purely illustrative and are not intended by the inventors to be in any sense limiting.

What is claimed is:

1. A method for generating a charged particle beam for irradiating a workpiece, the method comprising the steps of:

generating at least one charged particle beam in a vacuum chamber by particle emission from an emitter means, accelerating the charged particle beam toward a window means transversely mounted across the chamber and having an active area of predetermined length and width, deflecting the charged particle ribbon beam periodically back and forth in a sweep pattern in accordance with a predetermined deflection driving signal in order to define a sweep field which includes the active area of the window means, dynamically converging the deflected charged particle beam onto and through the active area of the window means in accordance with a convergence driving signal which is phase related to the deflection driving signal, so that the charged particle ribbon beam continuously impinges upon and sweeps approximately perpendicularly over the active area of the window means, and positioning the workpiece adjacent to the active area of the window means as the charged particle beam sweeps thereover thereby to cause electron bombardment of the workpiece.

2. The method set forth in claim 1 wherein active area of the window means follows the locus of a curve along a cross section of the predetermined length of the window means.

3. The method set forth in claim 1 wherein the charged particle beam is formed as a ribbon beam by particle emission from an elongated emitter means, and wherein the predetermined length of the window means is fixed in relation to a transverse dimension of the charged particle ribbon beam.

4. The method set forth in claim 3 wherein the step of generating at least one charged particle ribbon beam in a vacuum chamber by particle emission from an elongated emitter comprises the step of generating the ribbon beam by emission from a thermionic emitter.

5. The method set forth in claim 1 wherein the step of generating at least one charged particle beam in a vacuum chamber by particle emission from an emitter comprises the step of generating an electron beam by emission from a direct heater filament structure.

6. The method set forth in claim 5 wherein the step of generating an electron beam by emission from a direct heater filament structure comprises the steps of generating an electron ribbon beam by arranging two elongated direct heater filaments in a closely spaced apart, parallel arrangement and exciting each of the filaments with an alternating current out of phase with the other of the filaments, so that magnetic fields otherwise undesirably deflecting the electron beam are substantially cancelled.

7. The method set forth in claim 1 comprising the further steps of:

presetting a charged particle beam current, sensing in real time the current of the charged particle beam, comparing preset beam current with sensed real time beam current to generate a correction value, and adjusting the emitter means thereby automatically to control the charged particle emitter.

8. The method set forth in claim 7 wherein the workpiece comprises a continuous strand moving through a passage adjacent to the window means and comprising the further step of sensing strand velocity and controlling the rate at which the strand is moved so as to control radiation dosage and uniformity.

9. The method set forth in claim 8 comprising the further steps of deriving and recording radiation dosage values for the strand being irradiated during a radiation interval.

10. The method set forth in claim 1 comprising the step of flowing a cooling fluid exteriorly adjacent to the window means thereby to cool the window means by convection.

11. The method set forth in claim 10 comprising the further steps of sensing temperature at the vicinity of the window means, comparing sensed window vicinity temperature with a predetermined maximum window temperature, and automatically controlling flow rate of the cooling fluid passing exteriorly adjacent to the window means in order to keep the sensed window vicinity temperature below the predetermined maximum window temperature.

12. The method set forth in claim 10 comprising the further step of adding an evaporation means to the cooling fluid prior to its passage exteriorly adjacent to the window means, the evaporation means for adding to the cooling of the window means by the heat of evaporation thereof and for disturbing and breaking up surface boundary layers present adjacent to the exterior surface of the window means thereby enhancing heat transfer by convection to the cooling fluid.

13. The method set forth in claim 1 comprising the further steps of sensing temperature of structure defining the vacuum chamber, comparing sensed vacuum chamber vicinity temperature with a predetermined maximum vacuum chamber temperature, and automatically controlling flow rate of a cooling fluid passing through cooling passages adjacent to the vacuum chamber in order to keep sensed vacuum chamber vicinity temperature below the maximum vacuum chamber temperature.

14. The method set forth in claim 1 carried out by the steps of:
generating two charged particle ribbon beams at opposite ends of an elongated vacuum chamber by emission from two elongated emitters, one located at each end of the chamber, accelerating the charged particle ribbon beams toward the window means formed as a continuous tube means extending transversely across a central region of the vacuum chamber, the window tube means having a length related to the width of the charged particle ribbon beams,
dynamically deflecting each of the charged particle ribbon beams periodically back and forth to define two substantially congruent sweep fields which contain the window tube means therein in accordance with a common predetermined deflection driving signal,
dynamically converging the deflected charged particle ribbon beams onto opposite longitudinal regions of the active area of the window tube means in accordance with a predetermined convergence driving signal which is phase related to the deflection driving signal, so that the two charged particle ribbon beams sweep over substantially the entire active area of the window tube means, and drawing the strand to be irradiated through a generally cylindrical interior passageway defined by the window tube means as the ribbon beams sweep over the active area thereof, thereby to cause charged particle bombardment of the strand.

15. The method set forth in claim 1 comprising the further step of cancelling electromagnetic coupling between a deflection means performing the deflection step and a convergence means performing the convergence step to reduce crosstalk and distortion therebetween.

16. A method for irradiating a strand by charged bombardment, the method comprising:
generating two charged particle ribbon beams from charged particles emitted by plural charged particle emission means, each said emission means being at an oppositely facing end of an elongated vacuum chamber means,
accelerating the charged particle ribbon beams toward a window tube means extending transversely across a central region of the vacuum chamber, the window tube means having a length no less than the transverse dimension of the charged particle ribbon beams, dynamically deflecting each of the ribbon beams periodically back and forth to define two substantially congruent sweep fields which contain an active surface area of the window tube means therein in accordance with plural deflection signals which are phase related to each other,
dynamically converging the deflected ribbon beams onto opposite longitudinal regions of the active area of the window tube means in accordance with a predetermined convergence signal which is phase related to the deflection signals, so that the ribbon beams sweep approximately perpendicularly over substantially the entire active area of the window tube means, and
drawing the strand to be irradiated through an interior passageway defined by the tubular window as the ribbon beams sweep over the surface area, thereby to cause charged particle bombardment of the strand.

17. The method set forth in claim 16 comprising the further steps of:
presetting a charged particle ribbon beam current for each charged particle ribbon beam,
separately sensing in real time the current of the charged particle ribbon beams, and
comparing preset beam currents with sensed real time ribbon beam currents thereby automatically to control the plural charged particle beam emitter means.

18. The method set forth in claim 17 comprising the further step of sensing strand velocity and controlling the rate at which the strand is drawn through the window tube means so as to control radiation dosage and uniformity.

19. The method set forth in claim 17 comprising the further steps of collecting and recording radiation dosage values for the strand being irradiated during a radiation interval.

20. The method set forth in claim 16 comprising the step of flowing a cooling fluid exteriorly adjacent to the window means thereby to cool the window means by convection.

21. The method set forth in claim 20 comprising the further steps of sensing temperature at the vicinity of the window tube means, comparing sensed window vicinity temperature with a predetermined maximum window temperature, and automatically controlling flow rate of the cooling fluid passing through the interior of the window tube means with the strand in order to keep the sensed window vicinity temperature below the predetermined maximum window temperature.

22. The method set forth in claim 20 comprising the further step of adding an evaporation means to the cooling fluid prior to its passage exteriorly adjacent to the window means, the evaporation means for adding to the cooling of the window means by the heat of evaporation thereof and for disturbing and breaking up surface boundary layers present adjacent to the exterior surface of the window means thereby enhancing heat transfer by convection to the cooling fluid.

23. The method set forth in claim 16 comprising the further steps of sensing temperature at the vicinity of the vacuum chamber, comparing sensed vacuum chamber vicinity temperature with a predetermined maximum vacuum chamber temperature, and automatically controlling flow rate of a cooling fluid passing through cooling passages adjacent to the vacuum chamber in order to keep sensed vacuum chamber vicinity temperature below the maximum vacuum chamber temperature.

24. The method set forth in claim 16 wherein the step of generating each said particle beam comprises the step of generating an electron beam by emission from an elongated direct thermionic emission emitter means.

25. The method set forth in claim 24 wherein the generating step comprises the further steps of arranging two elongated direct heater filaments in a closely spaced apart, parallel arrangement and exciting one of the filaments with an amplitude-adjustable alternating current out of phase with the other of the filaments, so that in a region from which electron emission is drawn magnetic fields resulting from the alternating currents and otherwise distorting the ribbon electron beams are substantially cancelled.

26. The method set forth in claim 16 comprising the further step of cancelling electromagnetic coupling between plural deflection means performing the deflection steps and a convergence means performing the convergence step in order to reduce crosstalk and distortion therebetween.

27. A coaxial electron beam irradiator for irradiating a continuous strand at ground potential moving exteriorly adjacent to an elongated curved transmission window means of the irradiator, the irradiator comprising:
vacuum chamber means including the elongated curved window means for enclosing one end of the vacuum chamber means and having an axis of curvature disposed in substantial axial alignment with the axis of travel of the strand, the irradiation window having a predetermined longitudinal dimension,
electron beam emitter means for emitting electrons,
electron ribbon beam accelerator means for accelerating the electrons emitted from the emitter means in a direction toward the transmission window means,
dynamic beam deflection means for deflecting the electron beam back and forth across a predetermined sweep field which includes the elongated window,
dynamic beam convergence means for converging the electron ribbon beam approximately perpendicularly onto the elongated window at a location thereof which varies with the instantaneous deflection of the beam by the beam deflection means, thereby progressively to irradiate different surface regions of the strand as it moves adjacent to the window; and, further comprising:
high voltage generator means for generating and applying a predetermined negative high voltage to the emitter means relative to the strand,
deflection signal generator means for generating a deflection signal for causing said dynamic beam deflection means to deflect said electron beam, and
convergence signal generator means for generating a convergence signal related in phase to said deflection signal for causing said dynamic beam convergence means to converge the electron beam onto the irradiation window and onto the different surface regions of the strand moving exteriorly adjacent thereto.

28. The coaxial electron beam irradiator set forth in claim 27 wherein said vacuum chamber means is elongated and the irradiation window and dynamic beam convergence means are located at a central region thereof, the vacuum chamber means including:
oppositely facing electron ribbon beam emitter means at each end of the vacuum chamber, each for emitting electrons in a ribbon having a width related to the predetermined longitudinal dimension of the tubular irradiation window,
two oppositely facing electron ribbon beam accelerator means at each end of the vacuum chamber in front of the electron ribbon beam emitter means for accelerating the electrons emitted from the emitter means with which the said accelerator means is associated in a direction toward the centrally located irradiation window over a predetermined sweep field, the resultant sweep fields being substantially congruent,
and two oppositely facing dynamic beam deflection means, each located between a said accelerator means and the central window and driven by the deflection signal for deflecting the electron ribbon beam with which the said deflection means is associated back and forth across a predetermined sweep field which includes the elongated window, and wherein the elongated window is formed as a tube through which the strand passes.

29. The coaxial electron beam irradiator set forth in claim 28 wherein the convergence means includes an electromagnetic core surrounding the vacuum chamber and wherein the core defines central openings along the axis of travel of the strand providing physical access to the elongated irradiation window tube.

30. The coaxial beam irradiator set forth in claim 28 mounted within a moveable cart having casters.

31. The coaxial beam irradiator unit set forth in claim 29 wherein the vacuum chamber means is disposed substantially vertically and the two oppositely facing electron ribbon beam emitter means each comprises a symmetrical direct thermionic filament pair, and further comprising an upper pressure vessel containing toroidal filament transformer means in electrical connection with the upper emitter means, and a lower pressure vessel containing toroidal filament transformer means in electrical connection with the lower emitter means.

32. The coaxial beam irradiator unit set forth in claim 31 further comprising a high voltage coaxial conduit between the upper pressure vessel and the lower pressure vessel for conducting the negative high voltage from the high voltage power supply means to each of the emitter means.

33. The coaxial beam irradiator unit set forth in claim 31 further comprising pressurized fluidic insulation means within the upper and the lower pressure vessels.

34. The coaxial beam irradiator unit set forth in claim 33 wherein the fluidic insulation means comprises gaseous phase sulfur hexafluoride.

35. The coaxial beam irradiator set forth in claim 27 further comprising air pressure establishing means for establishing a positive air flow adjacent the surface of the curved transmission window, thereby to provide cooling of the window by convection.

36. The coaxial beam irradiator set forth in claim 35 further comprising evaporation agent means for supplying an evaporation agent to the positive air flow before it passes adjacent to the surface of the curved transmission window, the evaporation agent means for being evaporated by heat from the transmission window and thereby providing additional cooling to the curved transmission window by the heat of vaporization realized during evaporation.

37. The coaxial beam irradiator set forth in claim 36 wherein the evaporation agent means is carried onto an exterior ambient surface of the curved transmission window and which upon evaporation disturb a surface boundary layer at the surface, thereby increasing the convection of heat to the air flow.

38. The coaxial beam irradiator set forth in claim 27 further comprising cooling jacket means surrounding at least a portion of the vacuum chamber means.

39. The coaxial beam irradiator set forth in claim 27 further comprising beam current sensor means associated with the vacuum chamber means for sensing directly the beam current of the electron beam at the vicinity of the window.

40. The coaxial beam irradiator set forth in claim 27 further comprising control and monitoring computer means effectively connected to control said irradiator and to monitor and record operating conditions therein.

41. The coaxial beam irradiator set forth in claim 40 further including strand velocity sensing means for sensing the velocity of the strand moving adjacent to the irradiation window, and wherein the computer means is programmed for computing and recording the amount of irradiation dosage of the strand as a function of length thereof.

42. The coaxial beam irradiator set forth in claim 27 wherein the dynamic beam deflection means and the dynamic beam convergence means are undesirably coupled together in a magnetic circuit by structural elements comprising the coaxial beam irradiator, and further comprising uncoupling means for uncoupling the dynamic beam deflection means and the dynamic beam convergence means.

43. The coaxial beam irradiator set forth in claim 42 wherein the uncoupling means comprises at least one bucking loop means.

44. The coaxial beam irradiator set forth in claim 27 wherein the dynamic beam deflection means comprises a deflection amplifier means and a deflection coil means driven by the deflection amplifier means, wherein the dynamic beam convergence means comprises a convergence amplifier means and a convergence coil means driven by the convergence amplifier means, and a driving signal generator means for generating and supplying a common sweep frequency driving signal to the deflection amplifier means and to the convergence amplifier means.

45. The coaxial beam irradiator set forth in claim 44 wherein the driving signal generator means generates the common sweep frequency at approximately 100 hertz.

46. The coaxial beam irradiator set forth in claim 44 wherein the convergence amplifier means comprises a pulse width modulated amplifier having a clocking frequency higher than the common sweep frequency driving signal and wherein the driving signal generator means generates the common sweep frequency as a derivative of the clocking frequency of the pulse width modulated amplifier.

47. The coaxial beam irradiator set forth in claim 44 further comprising deflection AC clipping regulator means for controlling a power supply level supplied to the deflection amplifier means, thereby to control the magnitude of a dynamic deflection current supplied by the deflection amplifier means to the deflection coil means.

48. The coaxial beam irradiator set forth in claim 44 further comprising convergence AC clipping regulator means for controlling a power supply level supplied to the covergence amplifier means, thereby to control the magnitude of a dynamic convergence current supplied by the convergence amplifier means to the convergence coil means.

49. A method for irradiating a continuously fed workpiece by particle beam surface bombardment, the method comprising the steps of:
passing the workpiece exteriorly adjacent to a semi-cylindrically shaped irradiation window having a curved active area,
generating and emitting an accelerated particle beam from a fixed source towards the irradiation window,
cyclically redirecting the particle beam to sweep across the curved active area of the irradiation window and to converge toward a focal axis of the curved active area thereby to pass through the window and irradiate the workpiece passing exteriorly adjacent thereto.

50. The irradiation method set forth in claim 49 wherein the step of passing the workpiece exteriorly adjacent to a semi-cylindrically shaped irradiation window having a curved active area comprises the step of passing the workpiece adjacent to an elongated semi-cylindrically shaped irradiation window, wherein the step of generating and emitting an accelerated particle beam comprises the step of generating the particle beam to define a locus of a ribbon beam having an effective transverse dimension related to an axial length of the elongated irradiation window, and wherein the step of cyclically redirecting the particle beam across the curved active area comprises the step of converging the ribbon beam along longitudinal loci about the curved active area of the irradiation window.

51. The irradiation method set forth in claim 49 wherein the workpiece comprises a continuously fed strand.

52. The irradiation method set forth in claim 50 wherein the window is formed as a tube defining an interior longitudinal passageway through which the workpiece passes, and wherein the step of generating and emitting an accelerated particle beam as a ribbon comprises the step of generating a plurality of ribbon beams from plural, spatially displaced fixed sources.

53. The irradiation method set forth in claim 52 wherein the step of cyclically redirecting the ribbon beam to sweep across the area of the irradiation window and toward the strand comprises the step of cyclically sweeping across substantially the entirety of the active area of the irradiation window tube.

54. The irradiation method set forth in claim 53 wherein the step of generating a plurality of ribbon beams comprises the step of generating two radially opposed ribbon beams from substantially opposite sides of the window tube and wherein the step of cyclically sweeping across the area of the window tube comprises the step of directing the two radially opposed beams synchronously to radially opposed sides of the window tube throughout each sweep cycle, thereby to sweep through substantially the entirety of the active area of the window tube.

55. The irradiation method set forth in claim 52 comprising the further step of passing a cooling fluid through the longitudinal passageway of the window tube thereby to transfer heat from the window tube to the cooling fluid.

56. The irradiation method set forth in claim 55 comprising the further step of carrying an evaporation agent with the cooling fluid thereby to further cool the window tube by the heat of vaporization of the evaporation agent.

57. The irradiation method set forth in claim 49 wherein the step of generating and emitting an accelerated particle beam from a fixed source comprises the step of generating an electron beam.

58. The irradiation method set forth in claim 49 wherein the step of cyclically redirecting the particle beam comprises the steps of sweeping the particle beam by passage through a cyclical deflection field and converging the particle beam toward the active area of the irradiation window by passage through a dynamic convergence field in synchronism with the cyclical deflection field.

* * * * *